US012660172B2

(12) United States Patent
　　Baik

(10) Patent No.: US 12,660,172 B2
(45) Date of Patent: Jun. 16, 2026

(54) SEMICONDUCTOR DEVICE HAVING LOW-k SPACERS INCLUDE A CARBON-DOPED SILICON-BASED MATERIAL

(71) Applicant: SK hynix Inc., Gyeonggi-do (KR)

(72) Inventor: Hyo Won Baik, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 440 days.

(21) Appl. No.: 18/324,157

(22) Filed: May 26, 2023

(65) Prior Publication Data

US 2024/0172422 A1　　May 23, 2024

(30) Foreign Application Priority Data

Nov. 18, 2022　　(KR) ......................... 10-2022-0155340

(51) Int. Cl.
　　*H10B 12/00*　　　　(2023.01)
(52) U.S. Cl.
　　CPC ........... *H10B 12/482* (2023.02); *H10B 12/02* (2023.02)

(58) Field of Classification Search
　　CPC .... H10B 12/02; H10B 12/0335; H10B 12/30; H10B 12/315; H10B 12/482; H10B 12/485
　　See application file for complete search history.

(56) References Cited

U.S. PATENT DOCUMENTS

2018/0301412 A1* 10/2018 Borsari ............... H10B 12/315
2019/0115352 A1 4/2019 Ho et al.
2019/0296024 A1 9/2019 Ji et al.
2023/0005926 A1* 1/2023 Yang ..................... H10B 12/34

* cited by examiner

*Primary Examiner* — Hoai V Pham
(74) *Attorney, Agent, or Firm* — IP & T GROUP LLP

(57) ABSTRACT

A semiconductor device includes: a semiconductor substrate; a first conductive structure formed over the semiconductor substrate; and a spacer structure in which a diffusion barrier layer, a first low-k spacer, and a second low-k spacer having a higher dielectric constant than the first low-k spacer are sequentially stacked from a sidewall of the first conductive structure.

12 Claims, 36 Drawing Sheets

SEMICONDUCTOR DEVICE HAVING LOW-k SPACERS INCLUDE A CARBON-DOPED SILICON-BASED MATERIAL

CROSS-REFERENCE TO RELATED APPLICATIONS

The present application claims priority of Korean Patent Application No. 10-2022-0155340, filed on Nov. 18, 2022, which is incorporated herein by reference in its entirety.

BACKGROUND

1. Field

Various embodiments of the present invention relate to a semiconductor device and a method for fabricating the same, and more particularly, to a semiconductor device including a bit line, and a method for fabricating the semiconductor device.

2. Description of the Related Art

Recently, as semiconductor devices are being highly integrated, the spacing between the lines such as conductive structures is decreasing. The smaller spacing between the lines may cause parasitic capacitance between the lines. Therefore, a line structure capable of reducing the parasitic capacitance and a method for fabricating a semiconductor device including a wiring structure are under development.

SUMMARY

Embodiments of the present invention are directed to a semiconductor device capable of reducing the parasitic capacitance between neighboring conductive structures, and a method for fabricating the semiconductor device.

In accordance with one embodiment of the present invention, a semiconductor device includes: a semiconductor substrate; a first conductive structure formed over the semiconductor substrate; and a spacer structure in which a diffusion barrier layer, a first low-k spacer, and a second low-k spacer having a higher dielectric constant than the first low-k spacer are sequentially stacked from a sidewall of the first conductive structure.

In accordance with another embodiment of the present invention, a method for fabricating a semiconductor device includes: providing a semiconductor substrate; forming a plurality of first conductive structures that are spaced apart from each other in a first direction over the semiconductor substrate; sequentially forming a diffusion barrier layer, a first low-k layer, and a second low-k layer having a higher dielectric constant than the first low-k layer along a profile of an entire surface including the first conductive structures; and forming a spacer structure in which a diffusion barrier layer, a first low-k spacer, and a second low-k spacer are sequentially stacked from a sidewall of each of the first conductive structures by etching the second low-k layer, the first low-k layer, and the diffusion barrier layer.

DETAILED DESCRIPTION

Figure 1:
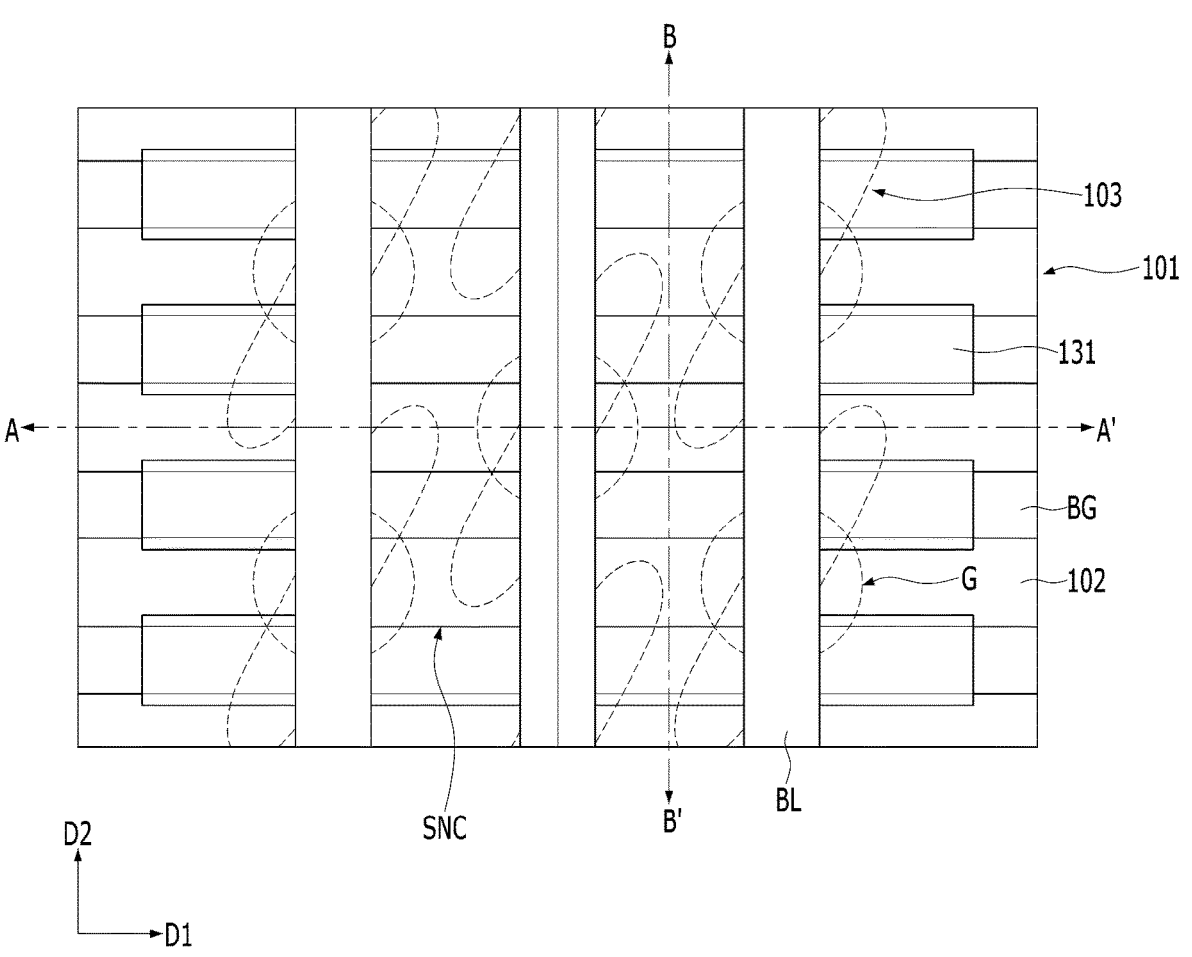
FIG. 1 is a plan view illustrating a semiconductor device in accordance with one embodiment of the present invention.

Different embodiments of the present invention will be described below in more detail with reference to the accompanying drawings. The present invention may, however, be embodied in different forms and should not be construed as limited to the embodiments set forth herein. Rather, these embodiments are provided so that this disclosure will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
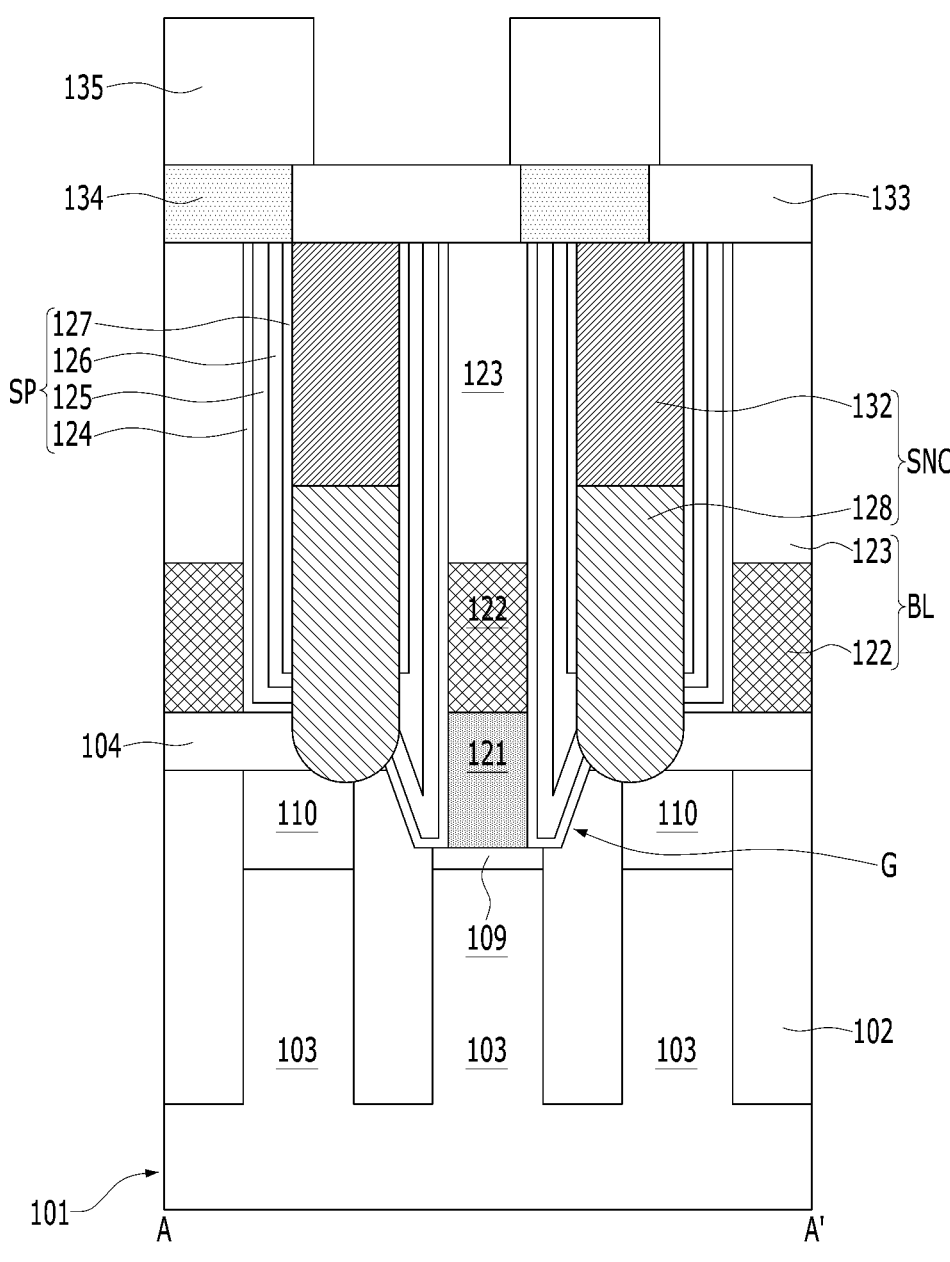
FIGS. 2A and 2B are cross-sectional views illustrating the semiconductor device in accordance with the embodiment illustrated in FIG. 1.
Figure 2B:
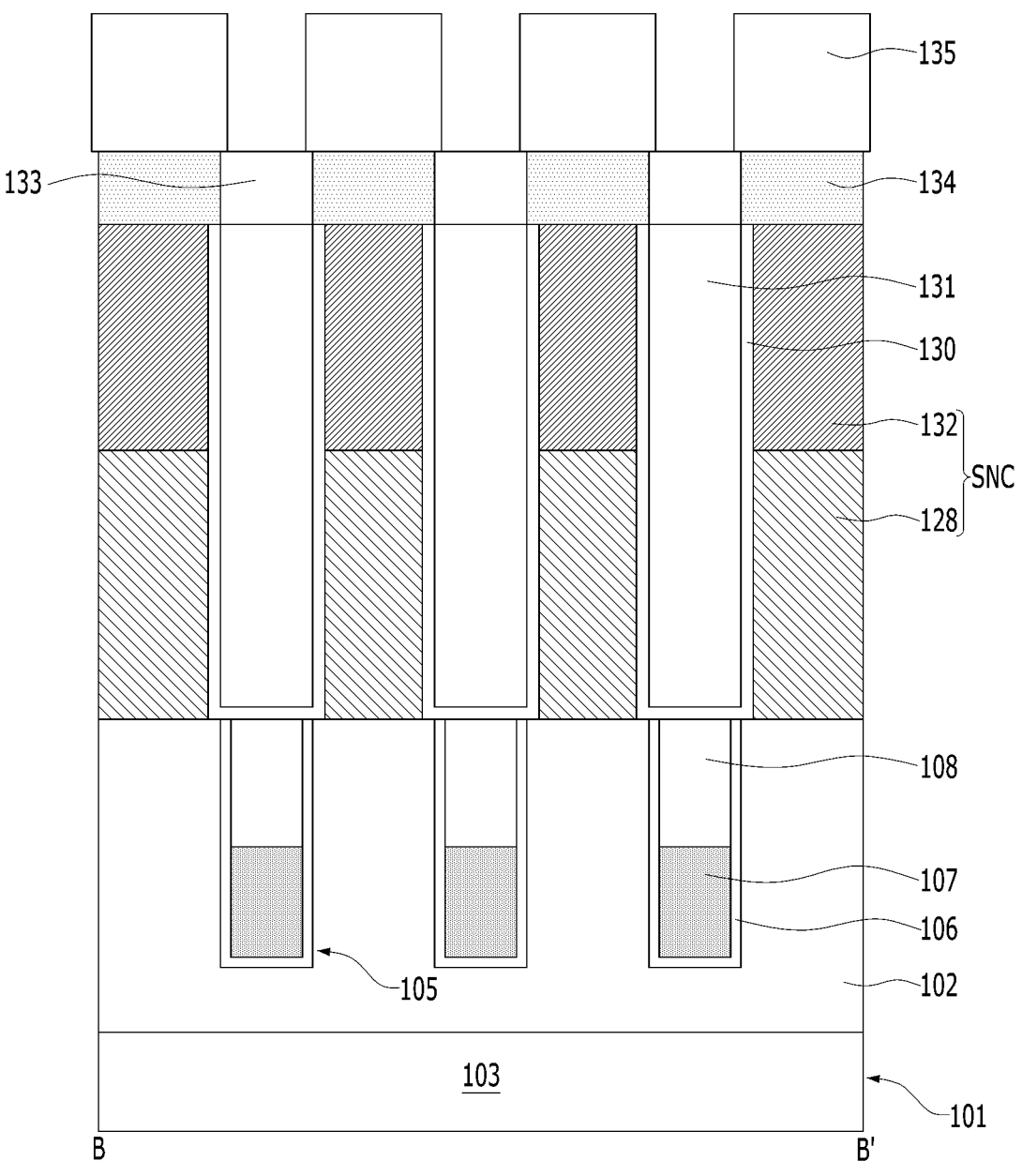

FIG. 1 is a plan view illustrating a semiconductor device in accordance with one embodiment of the present invention. FIGS. 2A and 2B are cross-sectional views illustrating the semiconductor device in accordance with the embodiment illustrated in FIG. 1.

Referring to FIGS. 1, 2A, and 2B, the semiconductor device may include a plurality of memory cells. Each of the memory cells may include a buried gate structure BG, a first conductive structure BL, a second conductive structure SNC positioned between the neighboring first conductive structures BL, and a memory element 135 (see FIG. 2A). The buried gate structure BG may extend in a first direction D1 and may be positioned to be spaced apart in a second direction D2. The first conductive structure BL may be referred to as a 'bit line structure BL'. The second conductive structure SNC may be referred to as a 'storage node contact plug SNC'. Hereinafter, the first conductive structure BL and the second conductive structure SNC may be referred to as a bit line structure BL and a storage node contact plug SNC, respectively. The bit line structures BL may extend in the second direction D2 and may be positioned to be spaced apart from each other in the first direction D1. The first direction D1 and the second direction D2 may cross each other perpendicularly. Two buried gate structures BG and one bit line structure BL may be positioned in one active region 103. The bit line structure BL may be electrically connected to the active region 103 between the buried gate structures BG.

The substrate 101 may be a silicon-containing material. The substrate 101 may be for example silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include other semiconductor materials such as germanium. The substrate 101 may be a III/V-group semiconductor substrate, for example, a compound semiconductor substrate, such as gallium arsenide (GaAs). The substrate 101 may be a Silicon-On-Insulator (SOI) substrate.

The isolation layer 102 may be formed by a Shallow Trench Isolation (STI) process. The active region 103 may be defined by the isolation layer 102. The active region 103 may have a bar shape having a major axis and a minor axis. The active region 103 may cross the first direction D1 and the second direction D2 which is perpendicular to the first direction D1. The major axis of the active region 103 may be tilted at a predetermined angle less than 90 degrees in the second direction D2, as seen in FIG. 1.

The buried gate structure BG may be formed in the substrate 101. As shown in FIG. 2B, the buried gate structure BG may include a gate dielectric layer 106 formed on the surface of the gate trench 105, a gate electrode 107 formed over the gate dielectric layer 106 to fill the gate trench 105, and a gate capping layer 108 formed over the gate electrode 107.

To be specific, a line-shaped gate trench 105 extending in the first direction D1 may be formed in the substrate 101. The gate trench 105 may be formed to a predetermined depth in a region defined by the hard mask layer 104 which is formed on the surface of the substrate 101. The bottom surface of the gate trench 105 may be positioned at a higher level than the bottom surface of the isolation layer 102. In other words, the gate trench 105 may have a shallower depth than the isolation layer 102. According to another embodiment of the present invention, the bottom portion of the gate trench 105 may have a curvature. According to another embodiment of the present invention, the isolation layer 102 in a direction where the gate trench 105 extends may be etched to a predetermined depth to form a fin region (not shown) in the active region 103.

A gate dielectric layer 106 may be formed on the surface of the gate trench 105. A gate electrode 107 filling a portion of the gate trench 105 may be formed over the gate dielectric layer 106. A gate capping layer (i.e., sealing layer) 108 filling the remaining portion of the gate trench 105 may be formed over the gate electrode 107. The upper surface of the gate capping layer 108 may be positioned at the same level as the upper surface of the hard mask layer 104. The upper surface of the gate electrode 107 may be positioned at a lower level than the upper surface of the substrate 101. The gate electrode 107 may be of a low-resistance metal material. The gate electrode 107 may be formed by sequentially stacking titanium nitride and tungsten. According to another embodiment of the present invention, the gate electrode 107 may be formed of titanium nitride only (TiN Only).

First and second impurity regions 109 and 110 may be formed in the substrate 101. The first and second impurity regions 109 and 110 may be referred to as source/drain regions. The first and second impurity regions 109 and 110 may be positioned to be spaced apart from each other by the gate trench 105. Accordingly, the gate electrode 107 and the first and second impurity regions 109 and 110 may become a cell transistor. The cell transistor may improve the short channel effect due to the gate electrode 107 of buried structure.

A bit line structure BL may be formed over the substrate 101. The bit line structure BL may be coupled to the substrate 101 through the bit line contact plug 121. The bit line contact plug 121 may be coupled to the first impurity region 109. The bit line contact plug 121 may be positioned in the bit line contact hole. The bit line contact hole may expose the first impurity region 109. The lower surface of the bit line contact plug 121 may be lower than the upper surface of the substrate 101. The bit line contact plug 121 may be formed of polysilicon or a metal material. A portion of the bit line contact plug 121 may have a line width which is smaller than the diameter of the bit line contact hole. Accordingly, gaps G may be formed on both sides of the bit line contact plug 121. The gaps G may be formed independently on both sides of the bit line contact plug 121. As a result, one bit line contact plug 121 and a pair of gaps G may be positioned in the bit line contact hole, and the pair of the gaps G may be separated by the bit line contact plug 121. A gap G may be positioned between the bit line contact plug 121 and the contact plug SNC.

A bit line structure BL may be formed over the bit line contact plug 121. The bit line structure BL may include a bit line 122 and a bit line hard mask 123 over the bit line 122. The bit line structure BL may extend in a direction crossing the buried gate structure BG, that is, in the second direction D2. A portion of the bit line 122 may be coupled to the bit line contact plug 121. Referring to FIG. 2A, the bit line 122 and the bit line contact plug 121 may have the same line width. Accordingly, the bit line 122 may extend in one direction while covering the bit line contact plug 121. The bit line 122 may be a metal material. The bit line hard mask 123 may be a dielectric material.

A spacer structure SP may be formed on the sidewalls of the bit line contact plug 121 and the bit line structure BL. The bottom portion of the spacer structure SP may fill the gaps G on both sides of the bit line contact plug 121. The spacer structure SP may extend parallel to both sidewalls of the bit line structure BL. The spacer structure SP may be formed to have a different stacked structure on the sidewall of the bit line contact plug 121 and the sidewall of the bit line structure BL. A stacked structure of first to third spacers 124, 125, and 126 may be formed on the sidewall of the bit line contact plug 121. A stacked structure of first to fourth spacers 124, 125, 126, and 127 may be formed on the sidewalls of the bit line structure BL.

According to another embodiment of the present invention, a stacked structure of the first to fourth spacers 124, 125, 126, and 127 may be formed on the sidewall of the bit line contact plug 121. According to another embodiment of the present invention, a stacked structure of first and second spacers 124 and 125 may be formed on the sidewall of the bit line contact plug 121.

A storage node contact plug SNC may be formed between the neighboring bit line structures BL. The storage node contact plug SNC may be positioned to be spaced apart from the bit line structure BL by the spacer structure SP. In other words, both sidewalls of the storage node contact plug SNC may be in contact with the spacer structures SP that are formed on the sidewalls of the opposing bit line structures BL, respectively. The storage node contact plug SNC may be coupled to the second impurity region 110. The storage node contact plug SNC may include a stacked structure of a lower plug 128 and an upper plug 132. According to another embodiment of the present invention, the storage node contact plug SNC may further include an ohmic contact layer between the lower plug 128 and the upper plug 132. For example, the lower plug 128 may be polysilicon, and the upper plug 132 may be a metal material.

As illustrated in FIG. 2B, plug separation layers 130 and 131 may be formed between the storage node contact plugs SNC that are adjacent in the second direction D2. The plug separation layers 130 and 131 may be formed between the neighboring bit line structures BL. The storage node contact plug SNC may be separated by the plug separation layers 130 and 131 that are adjacent in the second direction D2. Between the neighboring bit line structures BL, the plug separation layers 130 and 131 and the storage node contact plug SNC may be alternately positioned.

A landing pad 134 may be formed over the storage node contact plug SNC. The neighboring landing pads 134 may be separated by an inter-layer dielectric layer 133. The landing pad 134 may be a structure for interconnection between the storage node contact plug SNC and the memory element 135. The landing pad 134 may be a conductive material.

A memory element 135 may be formed over the landing pad 134. The memory element 135 may include a capacitor including a storage node. The storage node may be a pillar type. A dielectric layer and a plate node may be further formed over the storage node. The storage node may have a cylindrical shape other than a pillar shape. The storage node may be coupled to the contact structure SNC through the landing pad 136.

According to another embodiment of the present invention, memory elements may be coupled to the upper portion of the storage node contact structure SNC.

Hereafter, the spacer structure SP will be described in detail below.

The first spacer 124 may serve as a diffusion barrier that prevents impurities in the third and fourth spacers 126 and 127, that is, carbon, from being diffused externally into the substrate 101. In one embodiment, the first spacer 124 may be a liner layer that is continuously formed along the profile of the entire surface including the bit line contact plug 121 and the bit line structure BL, and in this embodiment the first spacer 124 may have a uniform thickness. The first spacer 124 may be formed to prevent the diffusion of the impurities and to have a minimum thickness for continuity. The first spacer 124 may be formed to a thickness of at least approximately 20 Å or more. For example, the first spacer 124 may be formed to a thickness of approximately 20 Å to 25 Å. The first spacer 124 may be a dielectric material. For example, the first spacer 124 may be silicon nitride.

According to a comparative example, when silicon nitride is formed to a thickness of approximately 10 Å or less as a seed layer instead of the first spacer 124, it is difficult to maintain continuity, and even if continuity is maintained, it is difficult to maintain a uniform thickness. Therefore, it may not serve as an effective diffusion barrier.

The second spacer 125 may be a dielectric material. For example, the second spacer 125 may be silicon oxide.

The third and fourth spacers 126 and 127 may be a dielectric material. The third and fourth spacers 126 and 127 may be applied to improve an issue where the average dielectric constant of the entire spacer structure SP increases as the thickness of the silicon nitride applied to the first spacer 124 increases, and consequently the parasitic capacitance increases. The total thickness of the third and fourth spacers 126 and 127 may be adjusted to have a maximum thickness that does not reduce the gap-fill margin of the storage node contact plug. The total thickness of the third and fourth spacers 126 and 127 may be greater than at least the thickness of the first spacer 124.

The third and fourth spacers 126 and 127 may be formed of a low-k material having a lower dielectric constant than silicon nitride.

The third spacer 126 may be a first low-k material. The fourth spacer 127 may be a second low-k material. The first low-k material may have a lower dielectric constant than the second low-k material. The second low-k material may have a dielectric constant of approximately 4.4 or less. The first low-k material may have a lower dielectric constant than the second low-k material. The first low-k material may have a dielectric constant of approximately 4.1 or less. The third spacer 126 may be an impurity-containing silicon-based material. The low dielectric constant of the third spacer 126 may be obtained by an impurity. The impurity-containing silicon-based material may be SiCO. The impurity-containing silicon-based material may be a carbon-doped silicon-based material. This is referred to herein as a low carbon-doped silicon-based material. The low carbon-doped silicon-based material may be low carbon-SiCO having a low carbon concentration. A carbon concentration of low carbon-SiCO is low may be equal to or lower than 10%. The third spacer 126 may have a lower dielectric constant than silicon oxide ($SiO_2$) and silicon nitride ($Si_3N_4$).

The fourth spacer 127 may be an impurity-containing silicon-based material. The low dielectric constant of the fourth spacer 127 may be obtained by an impurity. The impurity-containing silicon-based material may be SiCO. The impurity-containing silicon-based material may be SiCO having a low carbon concentration. This is referred to herein as 'High carbon-SiCO'. A carbon concentration of high carbon-SiCO is low may be equal to or lower than 20%. Accordingly, each of the third spacer 126 and the fourth spacer 127 may be SiCO, but the third spacer 126 may have a lower carbon concentration than the fourth spacer 127.

The thickness of the fourth spacer 127 may be adjusted to be smaller than the thickness of the third spacer 126. In this way, it may be possible to additionally contribute to reducing the parasitic capacitance by increasing the thickness of the third spacer 126.

The third spacer 126 and the fourth spacer 127 may have lower dielectric constants than that of typical silicon oxide. The fourth spacer 127 is referred to herein as a 'low-k spacer', and the third spacer 126 is referred to herein as an 'ultralow-k spacer'.

Accordingly, the spacer structure SP may be a stacked structure of N/O/UK/K (Nitride/Oxide/Ultralow-k/Low-k). In particular, according to one embodiment of the present invention, the spacer structure SP may be able to prevent deterioration that may be caused by the impurities in the third and fourth spacers 126 and 127 being diffused into the substrate 101 or the like by applying a diffusion barrier of at least approximately 20 Å to the sidewalls of the bit line structure BL and the bit line contact plug 121. Also, the parasitic capacitance may be increased by applying the third and fourth spacers 126 and 127 including low-k materials in order to increase the average dielectric constant of the spacer structure SP according to the increase in the thickness of the first spacer 124.

FIGS. 3A to 13 illustrate a method for fabricating a semiconductor device. FIGS. 3A, 4A, 5A, 6A, 7A, 8A, 9A, 10A, 11A, 12A and 13A are plan views. FIGS. 3B, 4B, 5B, 6B, 7B, 8B, 9B, 10B, 11B, 12B and 13B are cross sectional views that are taken along a A-A' of FIGS. 3A, 4A, 5A, 6A, 7A, 8A, 9A, 10A, 11A, 12A and 13A. FIGS. 3C, 4C, 5C, 6C, 7C, 8C, 9C, 10C, 11C, 12C and 13C are cross sectional views that are taken along a B-B' of FIGS. 3A, 4A, 5A, 6A, 7A, 8A, 9A, 10A, 11A, 12A and 13A.

Figure 3A:
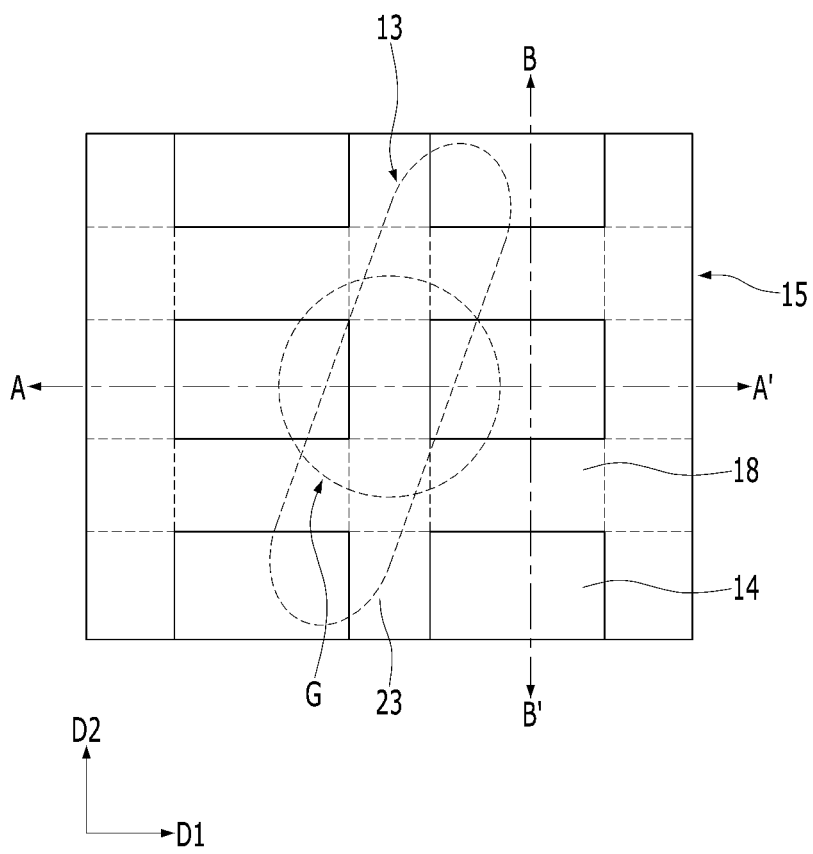
FIGS. 3A to 3C illustrate a method for fabricating a semiconductor device.
Figure 3B:
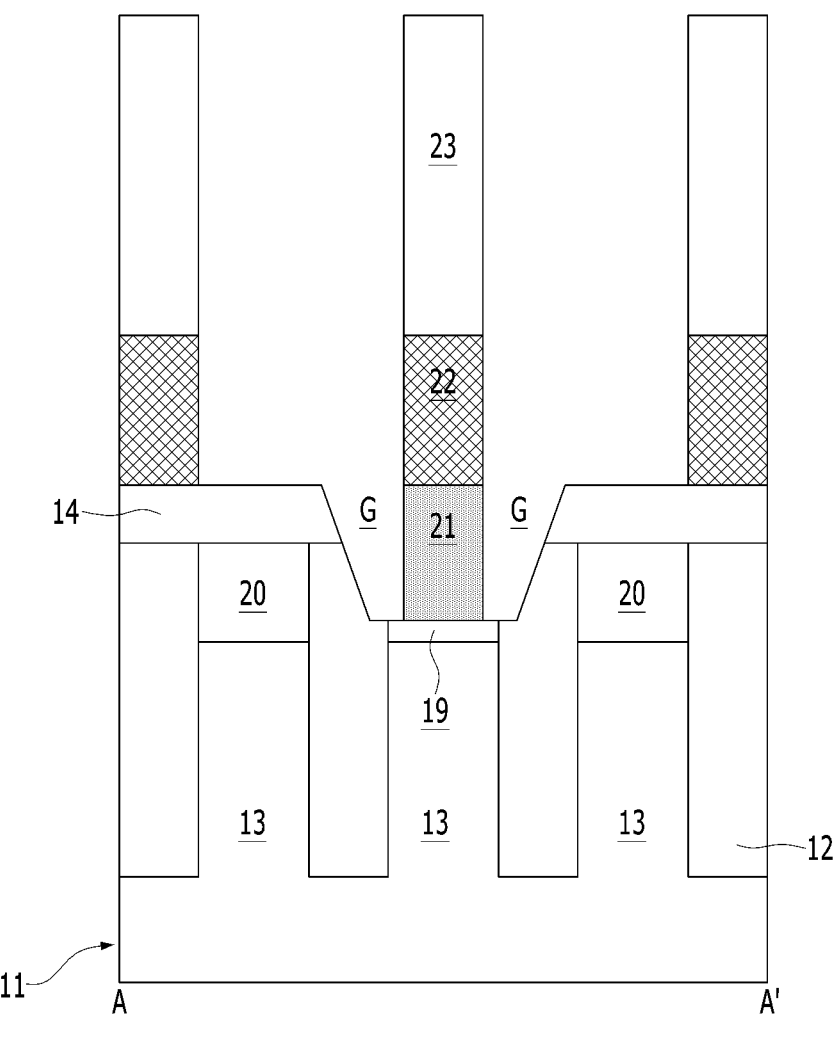
Figure 3C:
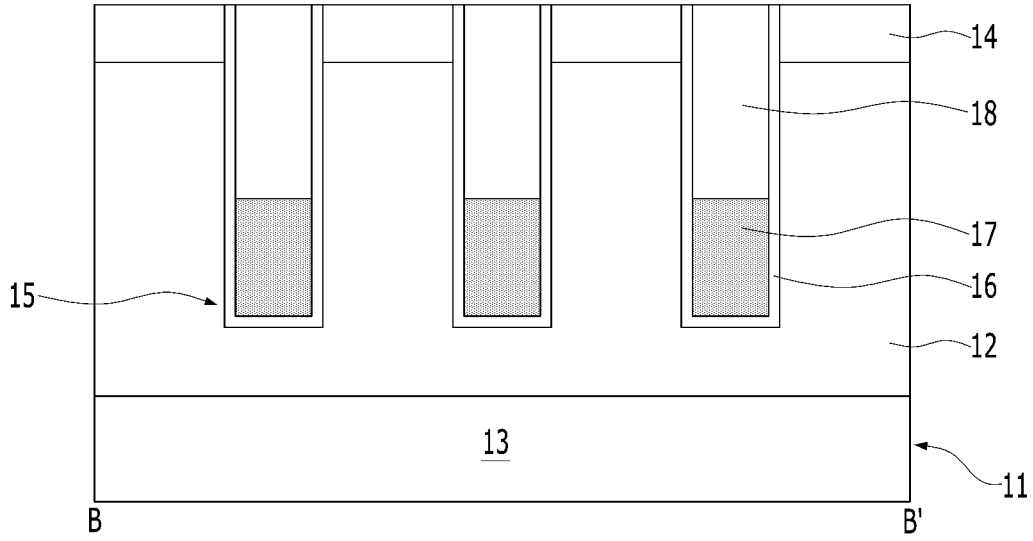

Referring to FIGS. 3A to 3C, an isolation layer 12 may be formed in a substrate 11. An active region 13 may be defined by the isolation layer 12. Each active region 13 may have an elongated bar shape.

The isolation layer 12 may be formed by a Shallow Trench Isolation (STI) process. The STI process may be performed as follows. The isolation layer 12 may be formed by etching the substrate 11 to form isolation trenches and filling the isolation trenches with a dielectric material. The isolation layer 12 may include silicon oxide, silicon nitride, or a combination thereof. The isolation trenches may be filled with a dielectric material by Chemical Vapor Deposition (CVD) or other deposition processes. A planarization process such as Chemical Mechanical Polishing (CMP) may be performed additionally.

Subsequently, a buried gate structure may be formed over the substrate 11. The buried gate structure may be referred to as a buried word line structure. The buried gate structure may include a gate trench 15, a gate dielectric layer 16 covering the bottom surface and sidewalls of the gate trench 15, and a gate electrode 17 partially filling the gate trench 15 over the gate dielectric layer 16, and a gate capping layer 18 formed over the gate electrode 17.

The buried gate structure may be formed as follows.

First, a gate trench 15 may be formed in the substrate 11. The gate trench 15 may have a line shape crossing the active region 13 and the isolation layer 12. The gate trench 15 may be formed by forming a mask pattern over the substrate 11 and performing an etching process using the mask pattern as an etching mask. In order to form the gate trench 15, a hard mask layer 14 may be used as an etch barrier. The hard mask layer 14 may be tetraethyl orthosilicate (TEOS). The gate trench 15 may be formed to be shallower than the isolation trenches. In other words, the bottom surface of the gate trench 15 may be positioned at a higher level than the bottom surface of the isolation layer 12. The gate trench 15 may have a depth that is sufficient to increase the average cross-sectional area of the gate electrode 17. Accordingly, the resistance of the gate electrode 17 may be reduced. According to another embodiment of the present invention, bottom edges of the gate trench 15 may have a curvature. By forming the bottom edges of the gate trench 15 to have a curvature, irregularities at the bottom portion of the gate trench 15 may be minimized, and thus filling of the gate electrode 17 may be performed without complications of such irregularities.

After the gate trench 15 is formed, a fin region may be formed. The fin region may be formed by recessing a portion of the isolation layer 12.

Subsequently, a gate dielectric layer 16 may be formed on the bottom surface and sidewalls of the gate trench 15. Before the gate dielectric layer 16 is formed, the damaged surface of the gate trench which is caused by the etching process may be cured. For example, after a sacrificial oxide is formed by thermal oxidation treatment, the sacrificial oxide may be removed.

The gate dielectric layer 16 may be formed by a thermal oxidation process. For example, the gate dielectric layer 16 may be formed by oxidizing the bottom surface and sidewalls of the gate trench 15.

According to another embodiment of the present invention, the gate dielectric layer 16 may be formed by a deposition method, such as Chemical Vapor Deposition (CVD) or Atomic Layer Deposition (ALD). The gate dielectric layer 16 may be for example a high-k material, an oxide, a nitride, an oxynitride, or a combination thereof. The high-k material may be a hafnium-containing material. The hafnium-containing material may be for example hafnium oxide, hafnium silicon oxide, hafnium silicon oxynitride, or a combination thereof. According to other embodiments of the present invention, the high-k material may be for example lanthanum oxide, lanthanum aluminum oxide, zirconium oxide, zirconium silicon oxide, zirconium silicon oxynitride, aluminum oxide, and combinations thereof. As for the high-k material, other known high-k materials may be used.

According to another embodiment of the present invention, the gate dielectric layer 16 may be formed by depositing a liner polysilicon layer and then radical-oxidizing the liner polysilicon layer.

According to another embodiment of the present invention, the gate dielectric layer 16 may be formed by forming a liner silicon nitride layer and then radical-oxidizing the liner silicon nitride layer.

Subsequently, a gate electrode 17 may be formed over the gate dielectric layer 16. The gate electrode 17 may be formed by forming a conductive layer to fill the gate trench 15 and then performing a recessing process. The recessing process may be performed by performing an etch-back process or by sequentially performing a CMP process and an etch-back process. The gate electrode 17 may be recessed such that the gate electrode fills only a portion of the gate trench 15. In other words, the upper surface of the gate electrode 17 may be positioned at a lower level than the upper surface of the substrate 11. The gate electrode 17 may be a metal, a metal nitride, or a combination thereof. For example, the gate electrode 17 may be formed of titanium nitride (TiN), tungsten (W), or a stack of titanium nitride/tungsten (TiN/W). The titanium nitride/tungsten (TiN/W) stack may have a structure formed by conformally forming titanium nitride on the gate dielectric layer 16 and then partially filling the gate trench with tungsten. As for the gate electrode 17, titanium nitride may be used alone, which may be referred to as a gate electrode 17 of a 'TIN Only' structure.

Subsequently, a gate capping layer 18 may be formed over the gate electrode 17. The gate capping layer 18 may be a dielectric material. The remaining portion of the gate trench 15 over the gate electrode 17 may be filled with the gate capping layer 18. The gate capping layer 18 may be silicon oxide. According to another embodiment of the present invention, the gate capping layer 18 may have a Nitride-Oxide-Nitride (NON) structure. The upper surface of the gate capping layer 18 may be positioned at the same level as the upper surface of the hard mask layer 14. To this end, when the gate capping layer 18 is formed, a Chemical Mechanical Polishing (CMP) process may be performed using the upper surface of the hard mask layer 14 as an etch stop target.

After the buried gate structure is formed as described above, a first source/drain region 19 and a second source/drain region 20 may be formed. The first source/drain region 19 and the second source/drain region 20 may be formed by a doping process, such as ion implantation. The first source/drain region 19 and the second source/drain region 20 may have the same depth. According to another embodiment of the present invention, the first source/drain region 19 may be deeper than the second source/drain region 20. The first source/drain region 19 may be an area to which a bit line contact is coupled. The second source/drain region 20 may be an area to which a storage contact is coupled.

A cell transistor of a memory cell may be formed by the gate electrode 17, the first source/drain region 19, and the second source/drain region 20.

Subsequently, a first conductive structure coupled to the first source/drain region 19 may be formed. According to this embodiment of the present invention, the first conductive structure is referred to herein as a 'bit line structure'. Hereinafter, the first conductive structure will be referred to as a bit line structure. The bit line structure may include a stacked structure of a bit line 22 and a bit line hard mask 23.

The bit line structure may be formed as follows.

First, the hard mask layer 14 may be etched to form a bit line contact hole. The bit line contact hole may have a circular shape or an elliptical shape from the perspective of a plan view. A portion of the substrate 11 may be exposed through the bit line contact hole. The bit line contact hole may have a diameter which is controlled to a constant line width. The bit line contact hole may have a form of exposing a portion of the active region 13. For example, the bit line contact hole may expose the first source/drain region 19. The bit line contact hole may have a larger diameter than the width of the minor axis of the active region 13. Accordingly, in an etching process for forming the bit line contact hole, the first source/drain region 19, the isolation layer 12, and a portion of the gate capping layer 18 may be etched. In other words, the gate capping layer 18, the first source/drain region 19, and the isolation layer 12 below the bit line contact hole may be recessed to a predetermined depth. Accordingly, the bottom portion of the bit line contact hole may be extended into the substrate 11. As the bit line contact hole expands, the first source/drain region 19 may be recessed, and the upper surface of the first source/drain region 19 may be positioned at a higher level than the upper surface of the second source/drain region 20.

Subsequently, a preliminary plug may be formed to gap-fill the bit line contact hole. The preliminary plug may be formed by a Selective Epitaxial Growth (SEG) process. For example, the preliminary plug may be a SEG silicon phosphide (SiP). The preliminary plug may be formed without voids by the selective epitaxial growth process. According to another embodiment of the present invention, the preliminary plug may be formed by depositing polysilicon and performing a CMP process. The preliminary plug may fill the bit line contact hole. The upper surface of the preliminary plug may be positioned at the same level as the upper surface of the hard mask layer 14.

Subsequently, a conductive layer and a hard mask material layer may be stacked over the hard mask layer 14 including the preliminary plug. The conductive layer and the hard mask material layer may be sequentially stacked over the preliminary plug and the hard mask layer 14. The conductive layer may be a metal-containing material. The conductive layer may be a metal, a metal nitride, a metal silicide, or a combination thereof. According to the embodiment of the present invention, the conductive layer may be tungsten (W). According to another embodiment of the present invention, the conductive layer may be a stack of titanium nitride and tungsten (TiN/W). Herein, titanium nitride may serve as a barrier. The hard mask material layer may be formed of a dielectric material having an etch selectivity with respect to the conductive layer and the preliminary plug. The hard mask material layer may be silicon oxide or silicon nitride.

Subsequently, a bit line mask layer may be formed over the hard mask material layer. The bit line mask layer may be formed of a material having an etch selectivity with respect to the conductive layer and the hard mask material layer. The bit line mask layer may be a photoresist film pattern. The bit line mask layer may be formed by a patterning method, such as Spacer Patterning Technique (SPT) or Double Patterning Technique (DPT). From the perspective of a plan view, the bit line mask layer may have a line shape extending in the second direction D2.

Subsequently, the hard mask material layer, the conductive layer, and the preliminary plug may be sequentially etched. As a result, a bit line contact 21, a bit line 22 and a bit line hard mask 23 may be formed.

The line width of the bit line structure may be smaller than the diameter of the bit line contact hole. Thus, gaps G may be formed around the bit line contact 21. The gaps G may not have a surrounding shape that surrounds the bit line contact 21 but may be formed independently on both sidewalls of the bit line contact 21. As a result, one bit line contact 21 and a pair of gaps G may be positioned in the bit line contact hole, and the pair of gaps G may be separated by the bit line contact 21. The lower surface of the gaps G may be positioned at the same level as the recessed upper surface of the first source/drain region 19. According to another embodiment of the present invention, the lower surface of the gaps G may extend into the isolation layer 12. In other words, the lower surface of the gaps G may be positioned at a lower level than the recessed upper surface of the first source/drain region 19.

Figure 4A:
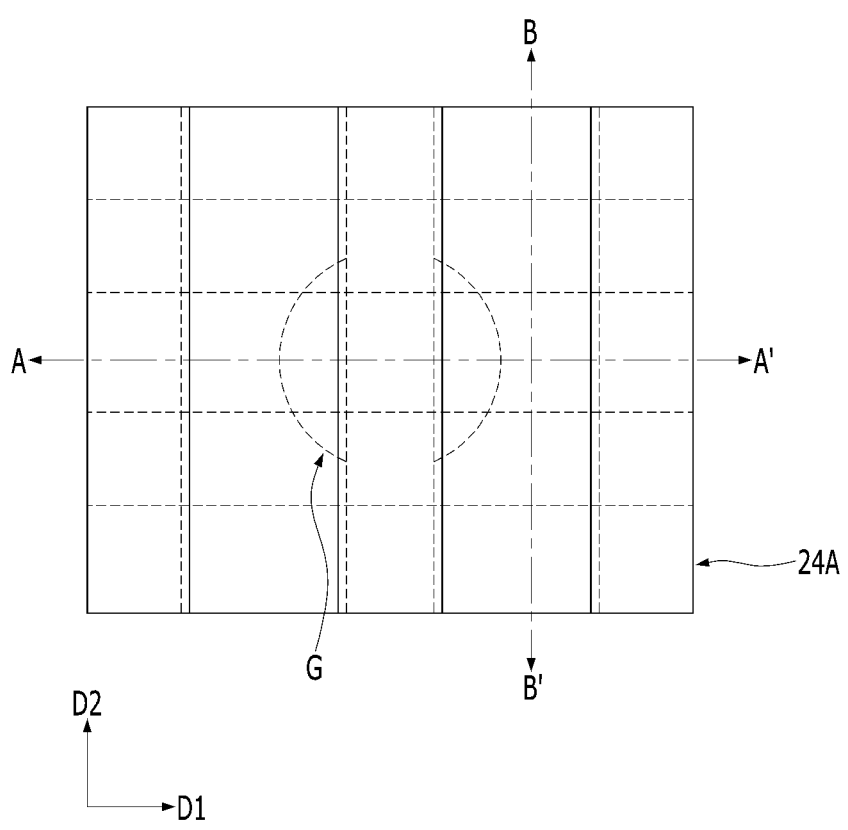
FIGS. 4A to 4C illustrate a method for fabricating a semiconductor device.
Figure 4B:
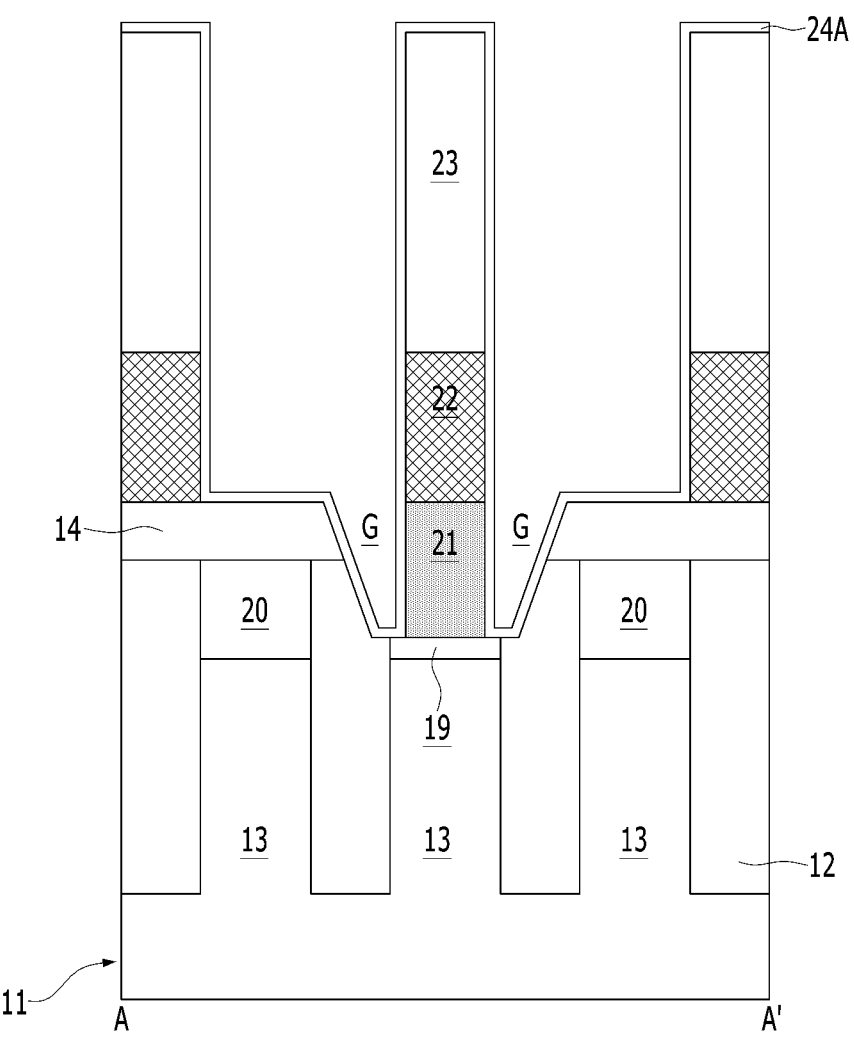
Figure 4C:
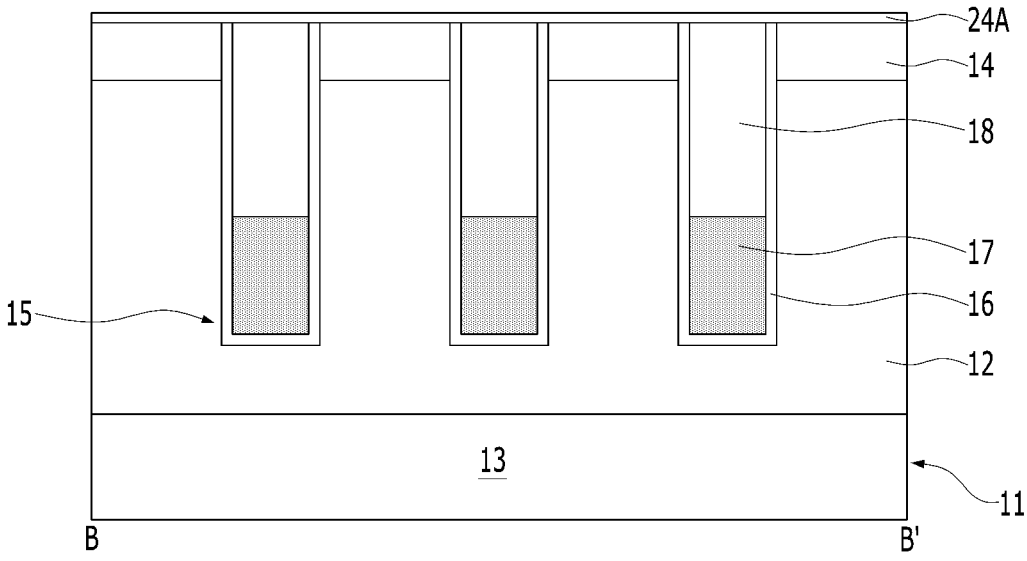

Referring to FIGS. 4A to 4C, a first spacer layer 24A may be formed. The first spacer layer 24A may be conformally formed along the profile of the entire surface including the bit line structure. The first spacer layer 24A may be a dielectric material. The first spacer layer 24A may serve as a diffusion barrier that prevents diffusion of the impurities in spacers that are to be formed through a subsequent process into the substrate 11 or the like. The first spacer layer 24A may be silicon nitride. The first spacer layer 24A may be formed through a plasma nitridation process. The first spacer layer 24A may be formed to have a minimum thickness that may prevent diffusion of the impurities and have continuity. The first spacer layer 24A may be a liner layer having a continuous and uniform thickness along the profile of the entire surface including the bit line structure. The first spacer layer 24A may be formed to a thickness of at least approximately 20 Å or more. For example, the first spacer layer 24A may be formed to have a thickness of approximately 20 Å to 25 Å.

As the first spacer layer 24A is formed of silicon nitride, it is possible to omit a process of forming a seed layer which is performed before a general bit line spacer is formed. Also, since the seed layer is formed to have a thickness of approximately 10 Å or less, it is difficult not only to avoid discontinuity from occurring but also to play a role of preventing diffusion due to the thin thickness. However, according to one embodiment of the present invention, since the first spacer layer 24A having a thickness of approximately 20 Å or more and having a continuous and uniform thickness is used, it is possible to effectively prevent the impurities in the spacers that are formed through a subsequent process from being diffused into the substrate 11.

Figure 5A:
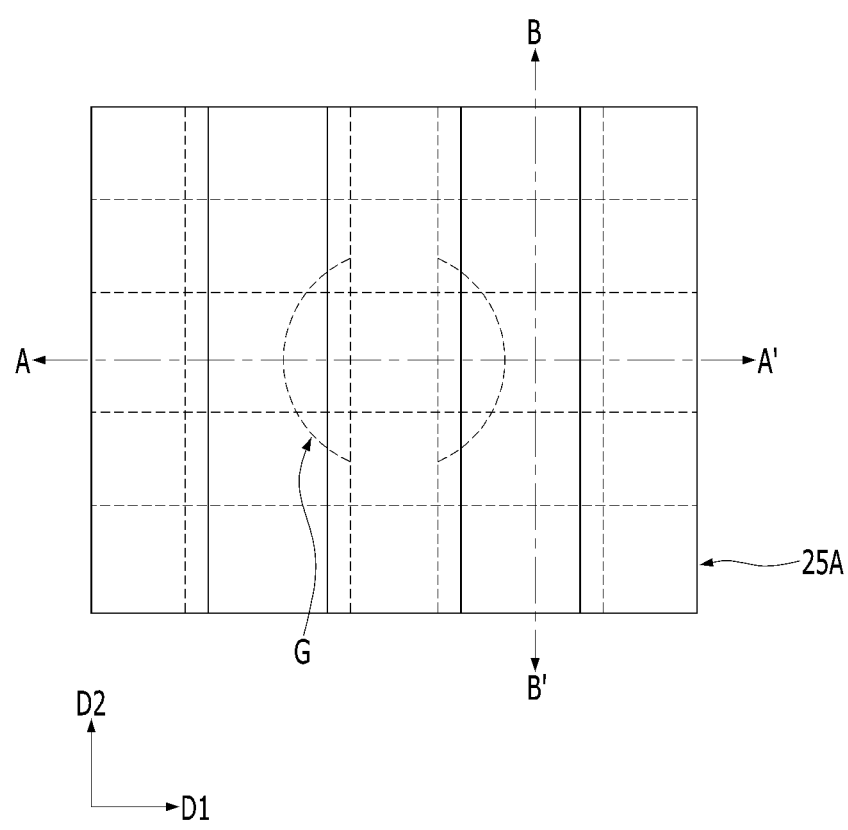
FIGS. 5A to 5C illustrate a method for fabricating a semiconductor device.
Figure 5B:
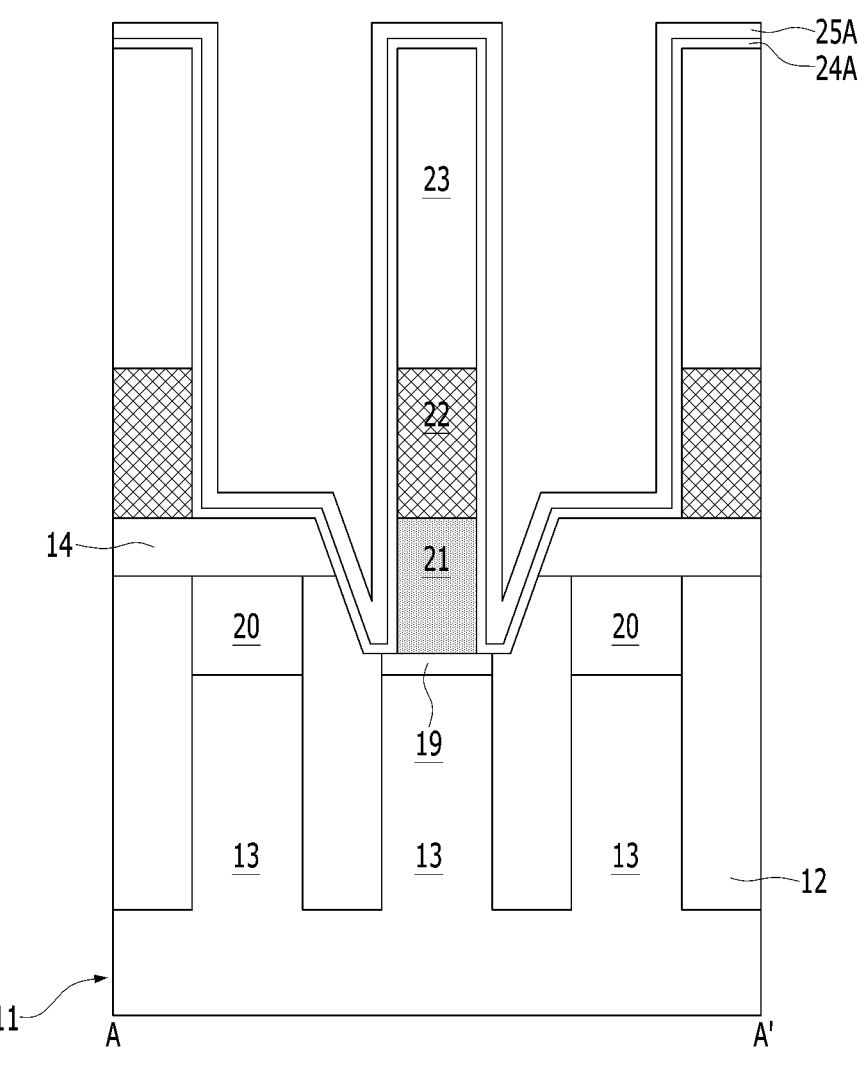
Figure 5C:
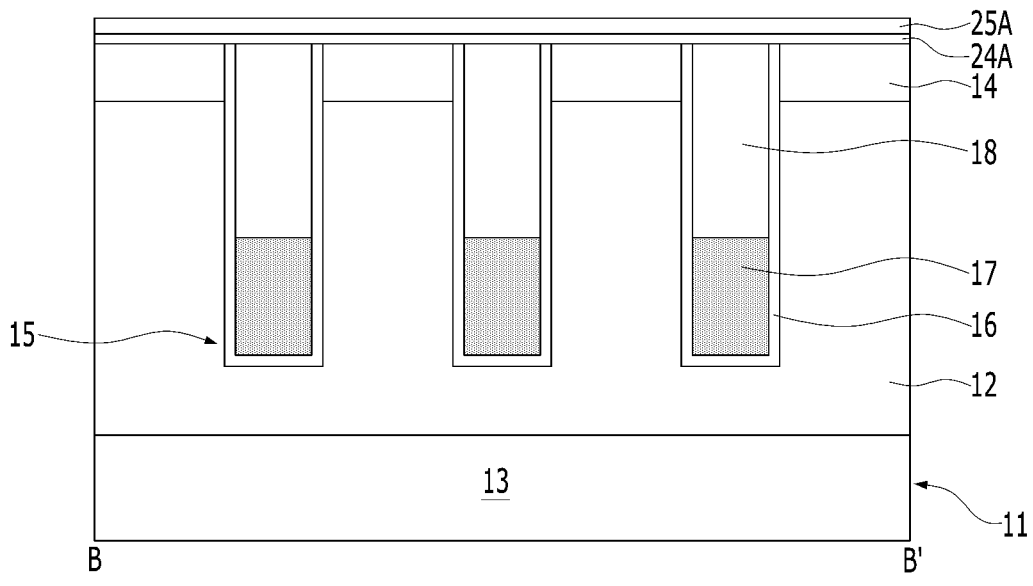

Referring to FIGS. 5A to 5C, a second spacer layer 25A may be formed over the first spacer layer 24A. The second spacer layer 25A may be conformally formed along the profile of the entire surface including the first spacer layer 24A. The second spacer layer 25A may be a dielectric material. For example, the second spacer layer 25A may be silicon oxide. The second spacer layer 25A may have the same thickness as the thickness of the first spacer layer 24A or may be thicker than the thickness of the first spacer layer 24A. According to another embodiment of the present invention, a gap-fill spacer filling the gaps G may be formed before the second spacer layer 25A is formed. Herein, the second spacer layer 25A may be formed over the first spacer layer 24A and the gap-fill spacer.

Figure 6A:
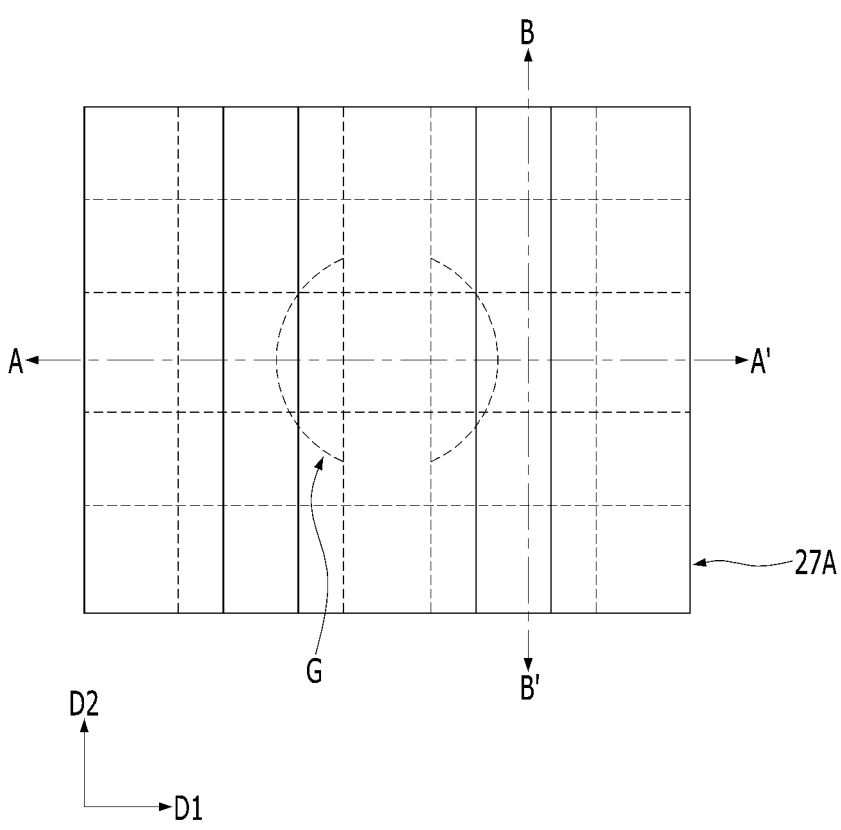
FIGS. 6A to 6C illustrate a method for fabricating a semiconductor device.
Figure 6B:
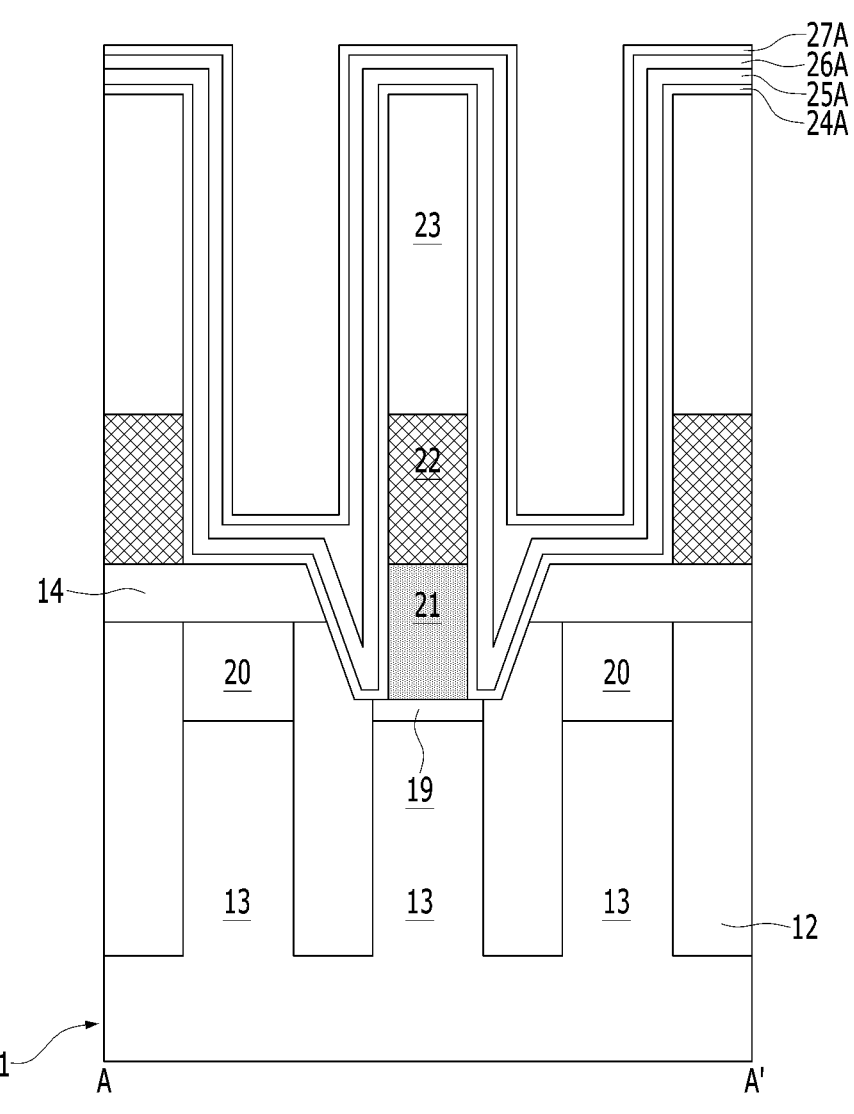
Figure 6C:
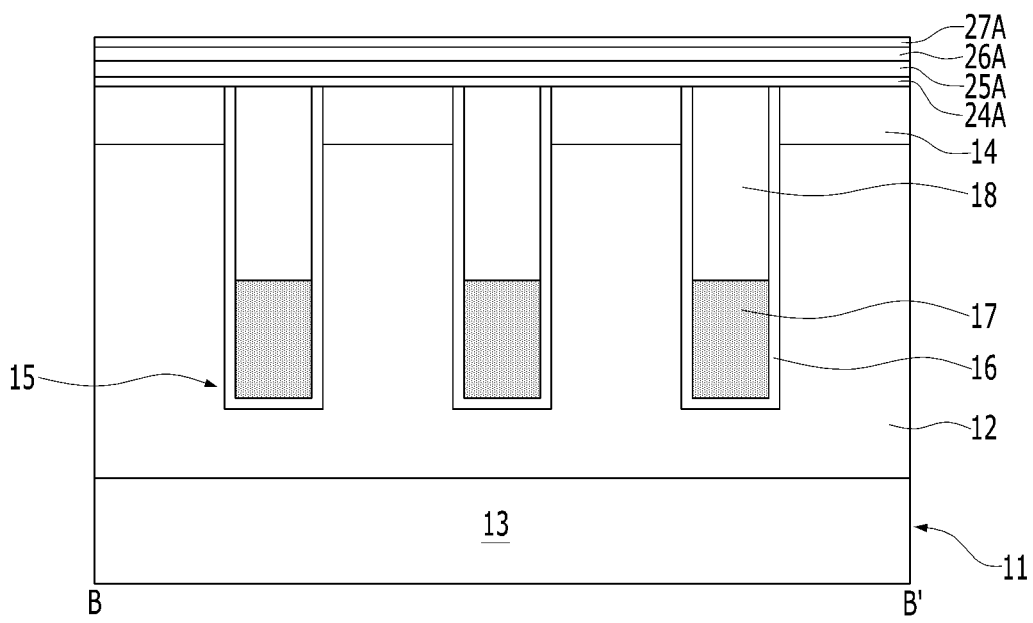

Referring to FIGS. 6A to 6C, a third spacer layer 26A and a fourth spacer layer 27A may be sequentially formed.

The third spacer layer 26A and the fourth spacer layer 27A may include a material whose etch rate is different from the etch rate of each of the first and second spacer layers 24A and 25A. The fourth spacer layer 27A may be a material whose etch rate is lower than the etch rate of at least the third spacer layer 26A. The third spacer layer 26A and the fourth spacer layer 27A may be a dielectric material.

The third spacer layer 26A and the fourth spacer layer 27A may be applied to increase the total dielectric constant of the bit line spacer according to the increase in the thickness of the first spacer layer 24A. In other words, the third spacer layer 26A and the fourth spacer layer 27A may be able to reduce the overall dielectric constant of the bit line spacer by applying a low-k material whose dielectric constant is lower than that of silicon nitride. The third spacer layer 26A and the fourth spacer layer 27A may be formed of a low-k material whose dielectric constant is lower than the dielectric constant of silicon nitride.

The third spacer layer 26A may be a first low-k material. The fourth spacer layer 27A may be a second low-k material. The first low-k material may have a lower dielectric constant than the second low-k material. The second low-k material may have a dielectric constant of approximately 4.4 or less. The first low-k material may have a lower dielectric constant than the second low-k material. The first low-k material may have a dielectric constant of approximately 4.1 or less.

The third spacer layer 26A may be an impurity-containing silicon-based material. The low dielectric constant of the third spacer layer 26A may be achieved by impurities. The impurity-containing silicon-based material may be SiCO. The impurity-containing silicon-based material may be a carbon doped silicon-based material. This is referred to herein as a low-carbon-doped silicon-based material. The low-carbon-doped silicon-based material may be low carbon-SiCO having a low carbon concentration. The third spacer layer 26A may have a lower dielectric constant than silicon oxide ($SiO_2$) and silicon nitride ($Si_3N_4$).

The fourth spacer layer 27A may also be an impurity-containing silicon-based material. The low dielectric constant of the fourth spacer layer 27A may be obtained by impurities. The impurity-containing silicon-based material may be SiCO. The impurity-containing silicon-based material may be SiCO having a high carbon concentration. This is referred to herein as 'High carbon-SiCO'.

Therefore, each of the third spacer layer 26A and the fourth spacer layer 27A may be SiCO, and the third spacer layer 26A may have a lower dielectric constant than the fourth spacer layer 27A and may have a low carbon concentration. As described above, in order to make the third spacer layer 26A have a lower dielectric constant than the fourth spacer layer 27A, for example, the process temperature of the third spacer layer 26A may be adjusted to be higher than the process temperature of the fourth spacer layer 27A. In another example, after a SiCO layer is formed during the process of forming the third spacer layer 26A, a hydrogen ($H_2$) treatment process may be additionally performed.

The thickness of the fourth spacer layer 27A may be adjusted to be smaller than that of the third spacer layer 26A. Accordingly, by increasing the thickness of the third spacer layer 26A, parasitic capacitance can be reduced additionally.

The third spacer layer 26A and the fourth spacer layer 27A may have lower dielectric constants than that of a typical silicon oxide. The fourth spacer layer 27A is referred to herein as a 'low-k spacer layer', and the third spacer layer 26A is referred to herein as an 'ultralow-k spacer layer'.

Figure 7A:
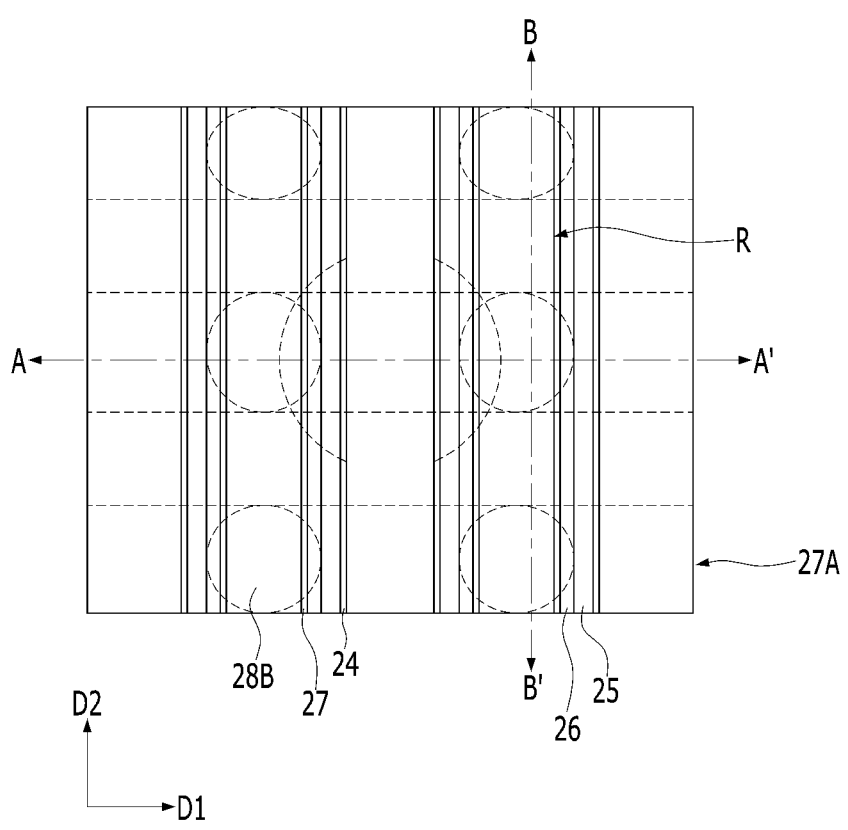
FIGS. 7A to 7C illustrate a method for fabricating a semiconductor device.
Figure 7B:
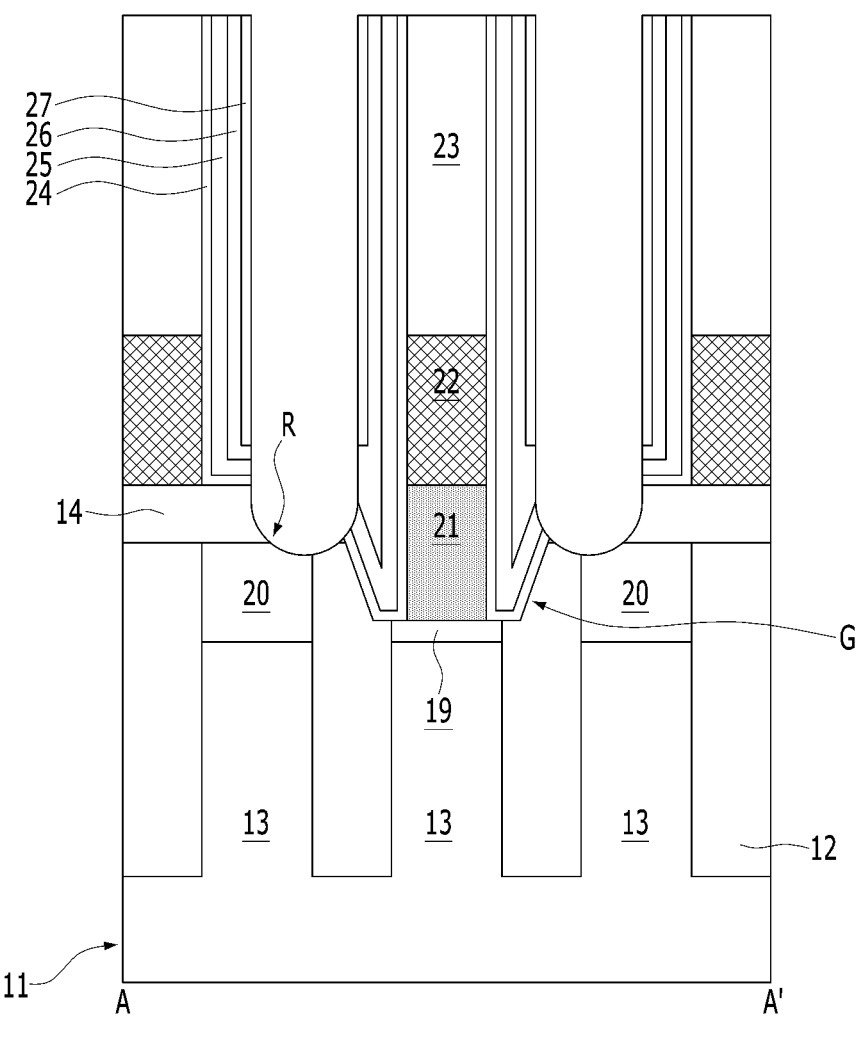
Figure 7C:
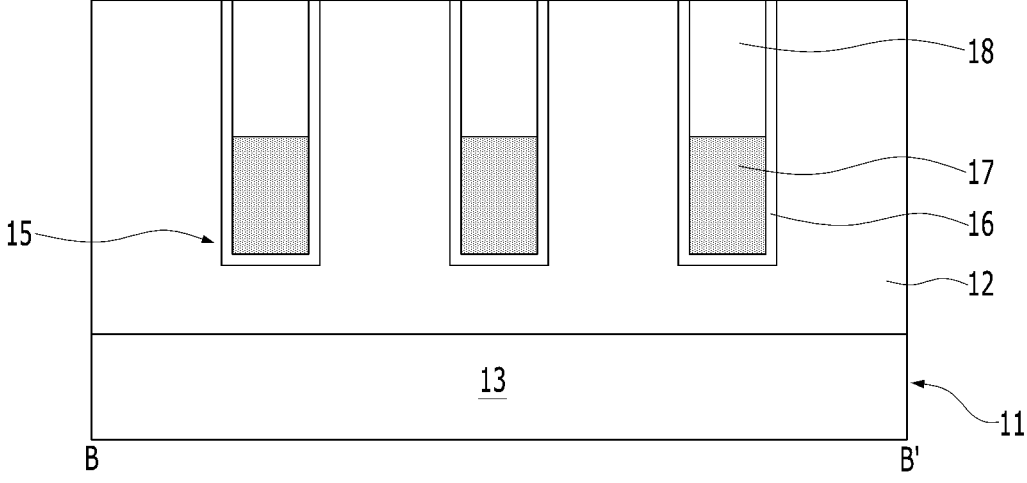

Referring to FIGS. 7A to 7C, a spacer structure in which first to fourth spacers 24, 25, 26, and 27 are stacked may be formed. To this end, the first to fourth spacer layers 24A, 25A, 26A, and 27A may be etched. As a result, the bit line hard mask 23 and the hard mask layer 14 may be exposed.

Thus, a spacer structure including a stacked structure of N/O/UK/K (Nitride/Oxide/Ultralow-k/Low-k) may be formed. In particular, in the spacer structure according to one embodiment of the present invention, a diffusion barrier of at least approximately 20 Å or more may be applied to the sidewalls of the bit line structure BL and the bit line contact plug 21 so that deterioration caused by the impurities in the third and fourth spacers 26 and 27 being diffused into the substrate 11 may be prevented. Also, by applying the third and fourth spacers 26 and 27 including low-k materials to improve the increase in the average dielectric constant of the spacer structure that occurs due to the increase in the thickness of the first spacer 24, the increase in parasitic capacitance may be improved.

Subsequently, a recess R (as illustrated in FIG. 7B) exposing a portion of the active region 13 may be formed by etching the exposed hard mask layer 14. To form the recess R, the hard mask layer 14, the isolation layer 12, and the second source/drain region 20 may be etched to a predetermined depth. The recess R may extend into the substrate 11. The bottom surface of the recess R may be positioned at a lower level than the upper surface of the bit line contact 22. The bottom surface of the recess R may be positioned at a higher level than the bottom surface of the bit line contact 22.

As the first to fourth spacers 24, 25, 26, and 27 and the recess R are formed, the storage node contact region in source/drain region may be exposed. The first to fourth spacers 24, 25, 26, and 27 may be formed on the sidewalls of the line-type bit line structure 22 and 23 extending in the second direction D2. Accordingly, the regions exposed by the first to fourth spacers 24, 25, 26, and 27 and the recess R may be of a line type extending in the second direction D2 and spaced apart from each other by the bit line structure 22 and 23.

Figure 8A:
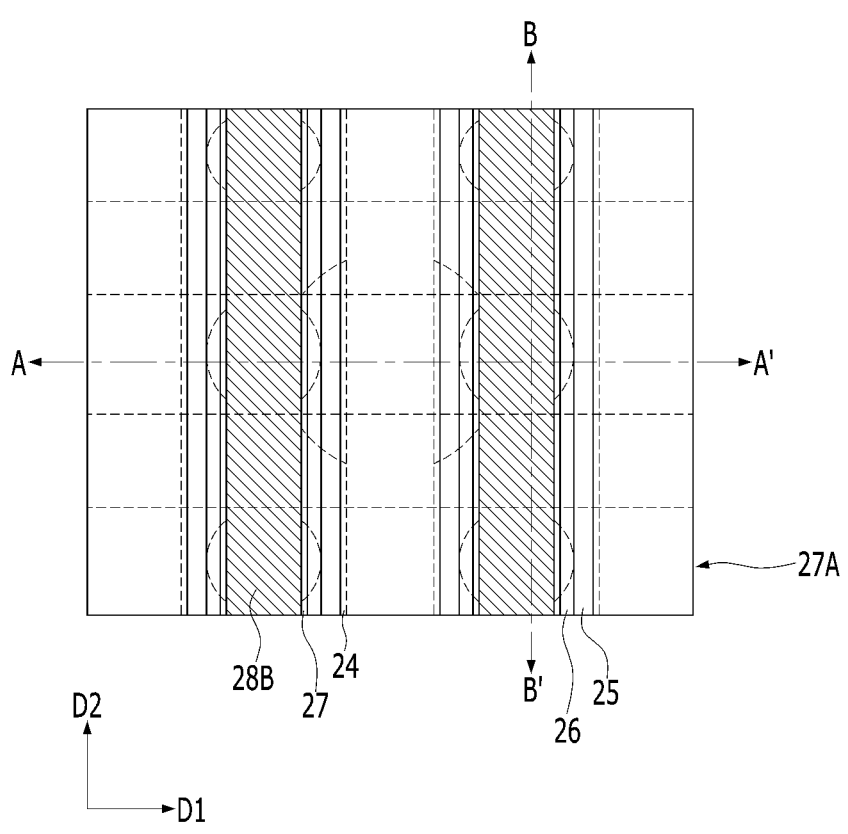
FIGS. 8A to 8C illustrate a method for fabricating a semiconductor device.
Figure 8B:
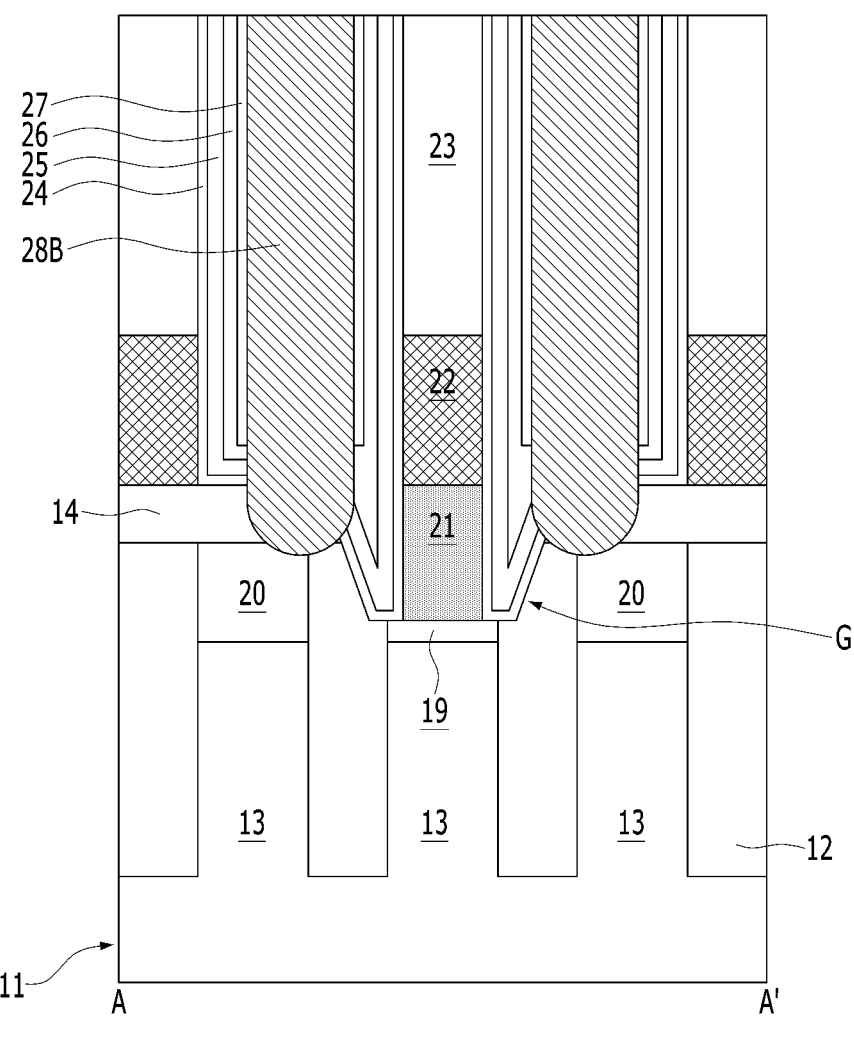
Figure 8C:
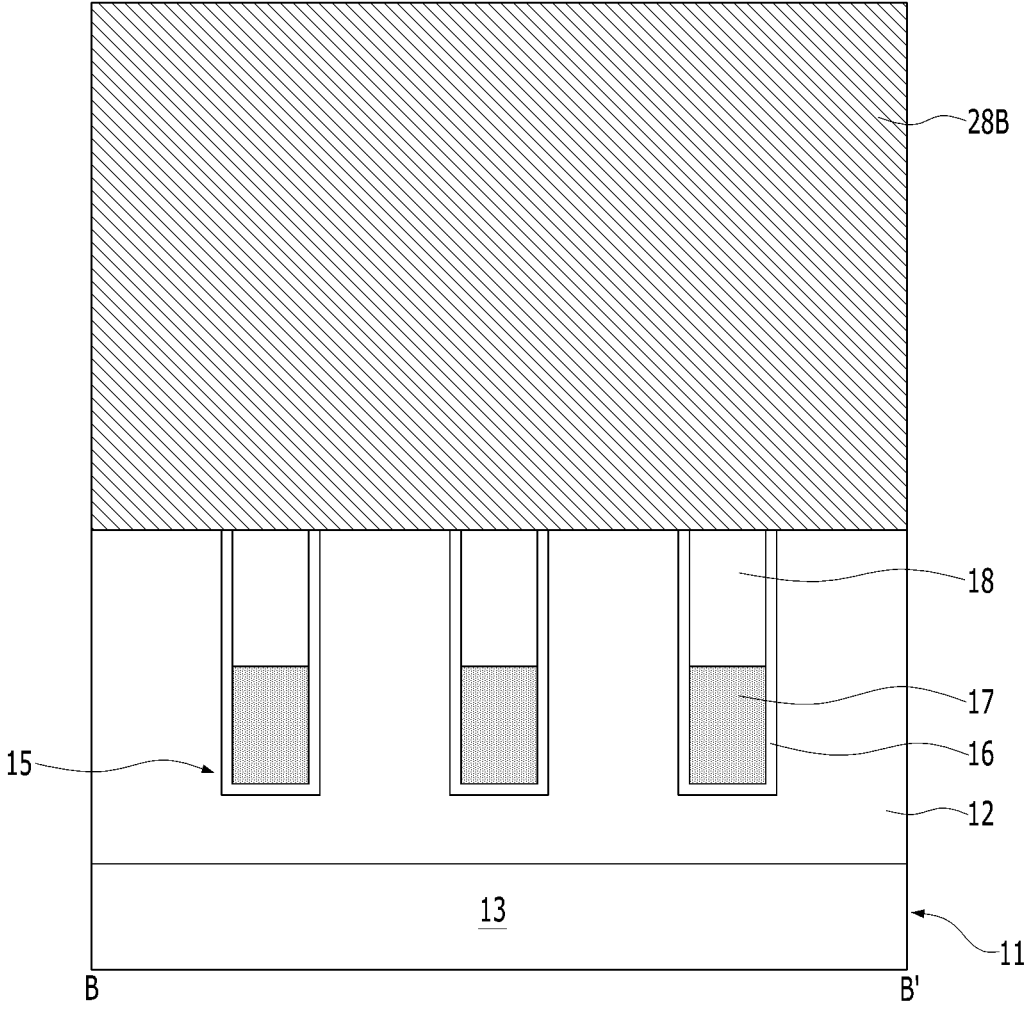

Referring to FIGS. 8A to 8C, a plug material layer 28B may be formed to gap-fill the storage node contact region. The plug material layer 28B may be formed such that all line-type storage node contact regions exposed by the bit line structures are gap-filled. The plug material layer 28B may be a conductive material. For example, the plug material layer 28B may be polysilicon.

Figure 9A:
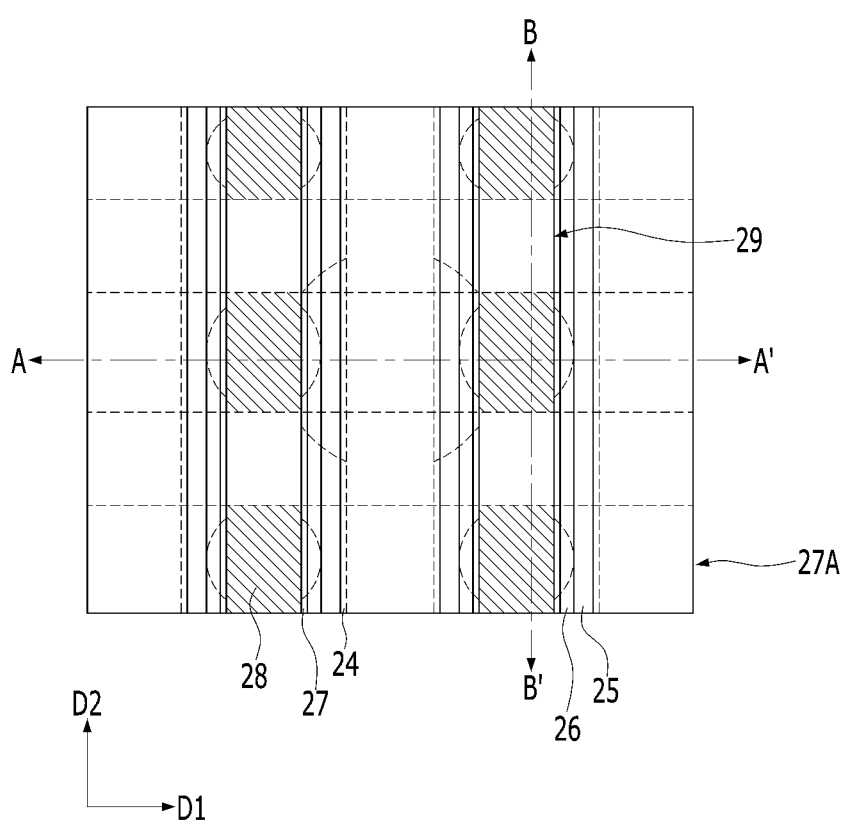
FIGS. 9A to 9C illustrate a method for fabricating a semiconductor device.
Figure 9B:
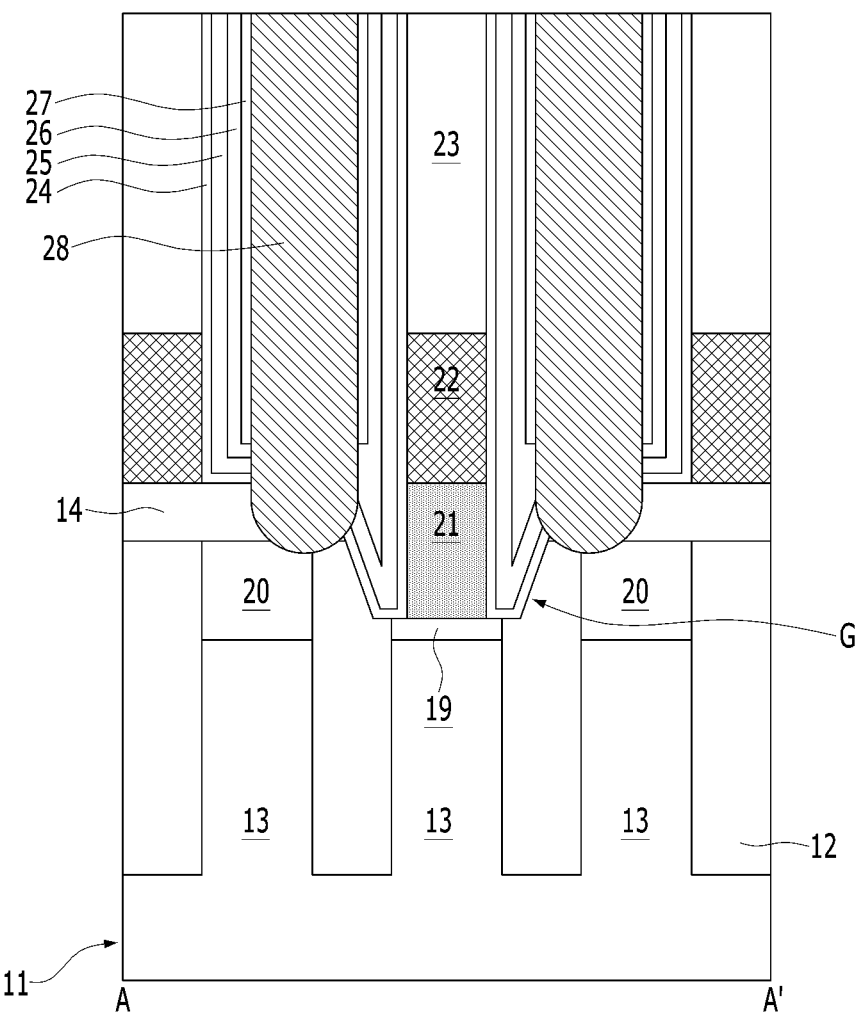
Figure 9C:
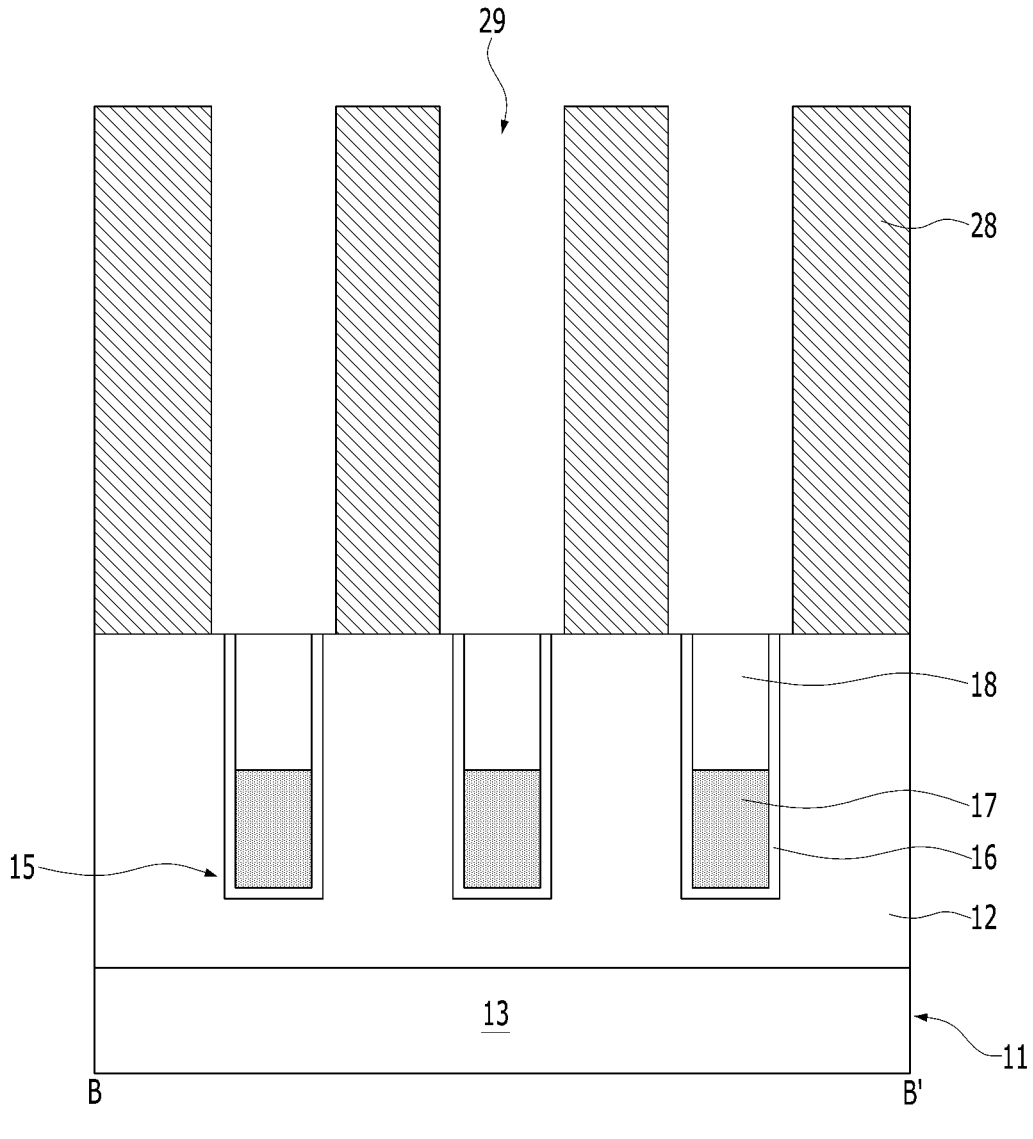

Referring to FIGS. 9A to 9C, a plug separation portion 29 may be formed. A first contact 28 may be defined by the plug separation portion 29. The first contact 28 may be electrically connected to the second source/drain region 20. The plug separation portion 29 may separate the first contact 28 in the second direction D2.

Figure 10A:
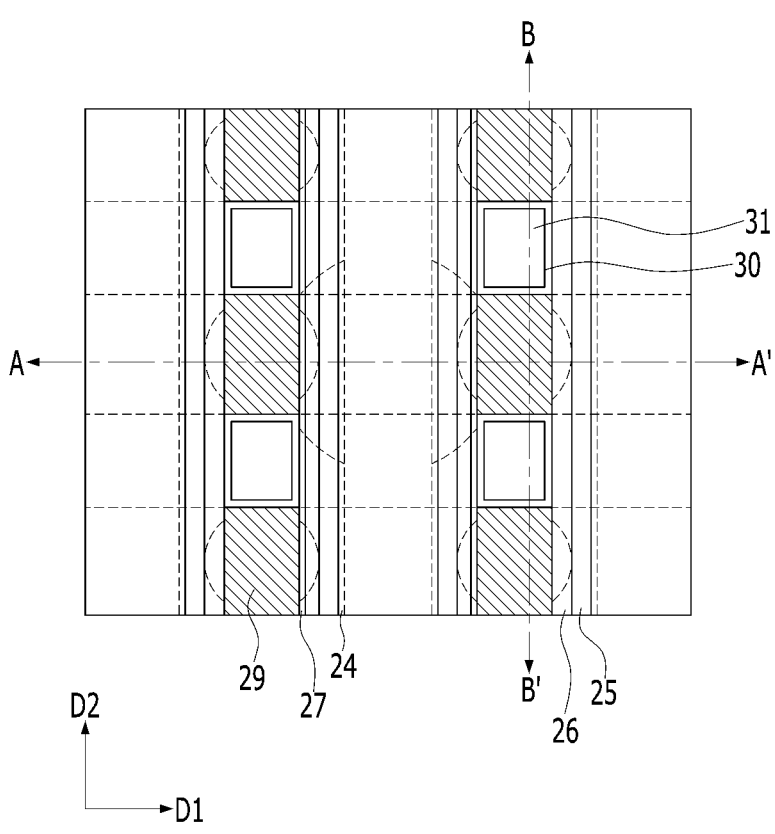
FIGS. 10A to 10C illustrate a method for fabricating a semiconductor device.
Figure 10B:
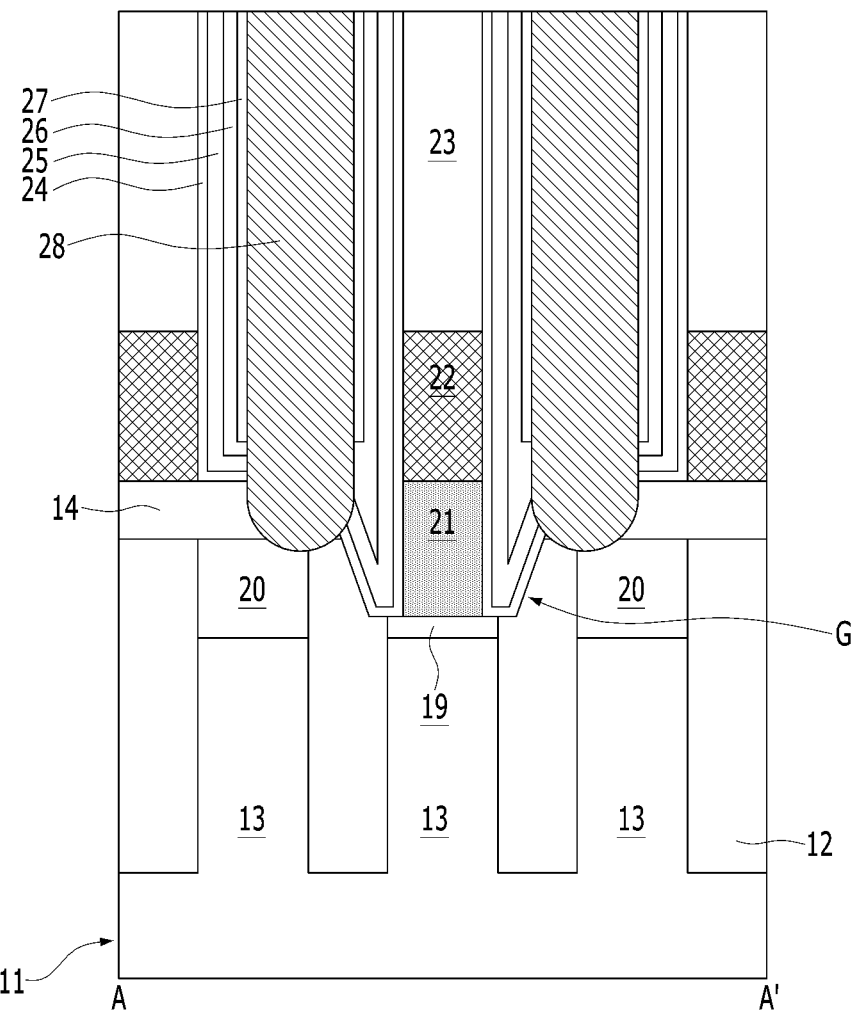
Figure 10C:
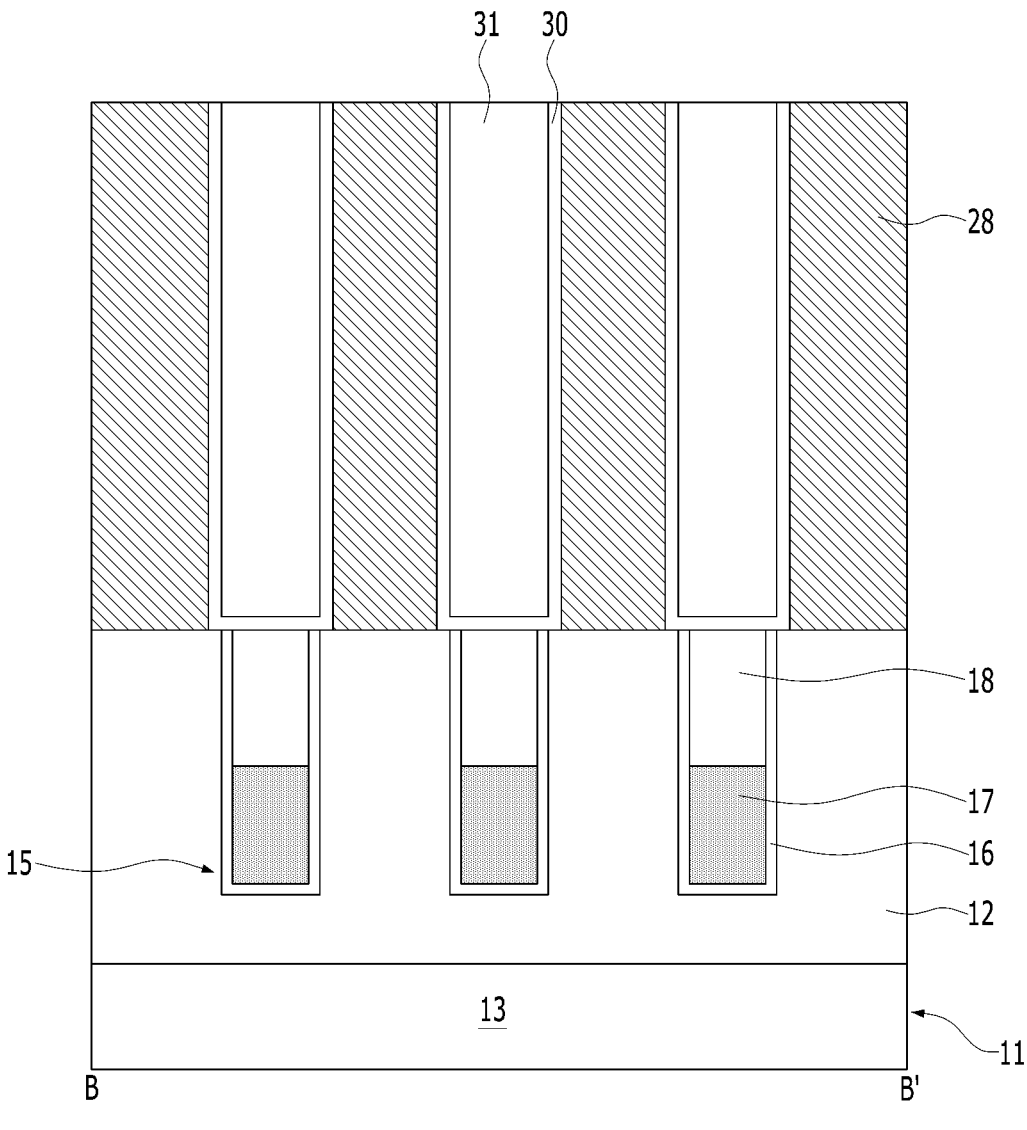

Referring to FIGS. 10A to 10C, first and second plug separation layers 30 and 31 may be sequentially formed in the plug separation portion 29. The first plug separation layer 30 may be conformally formed along the profile of the inner wall of the plug separation portion 29. The second plug separation layer 31 may be formed to fill the plug separation portion 29 over the first plug separation layer 30.

The first and second plug separation layers 30 and 31 may be a dielectric material. The first and second plug separation layers 30 and 31 may be formed of different materials. The first and second plug separation layers 30 and 31 may be formed of materials having different wet etching selectivity rates. For example, the first plug separation layer 30 may be silicon oxide. For example, the second plug separation layer 31 may be silicon nitride.

Figure 11A:
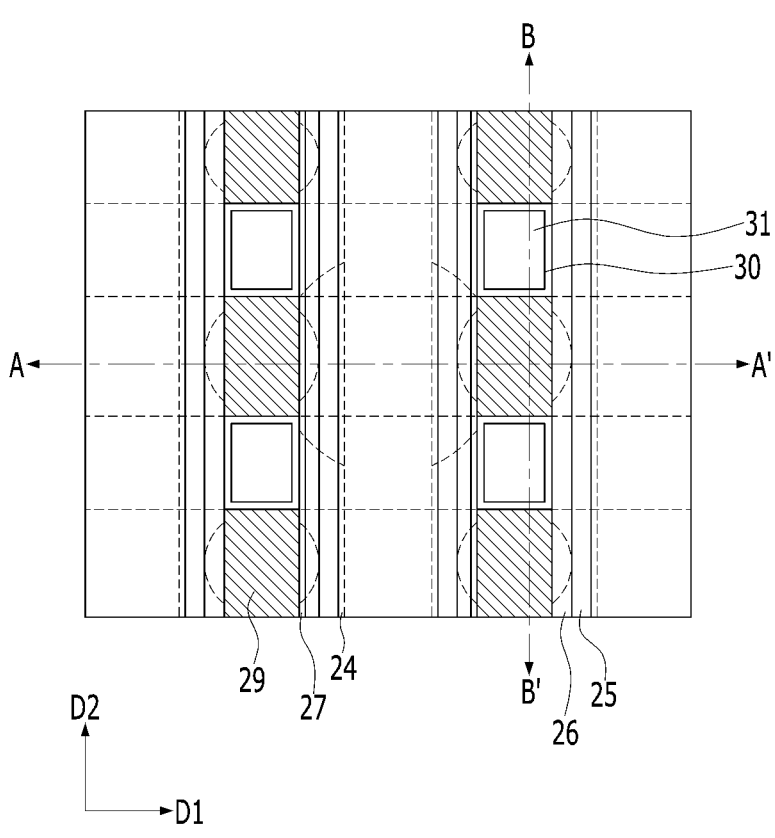
FIGS. 11A to 11C illustrate a method for fabricating a semiconductor device.
Figure 11B:
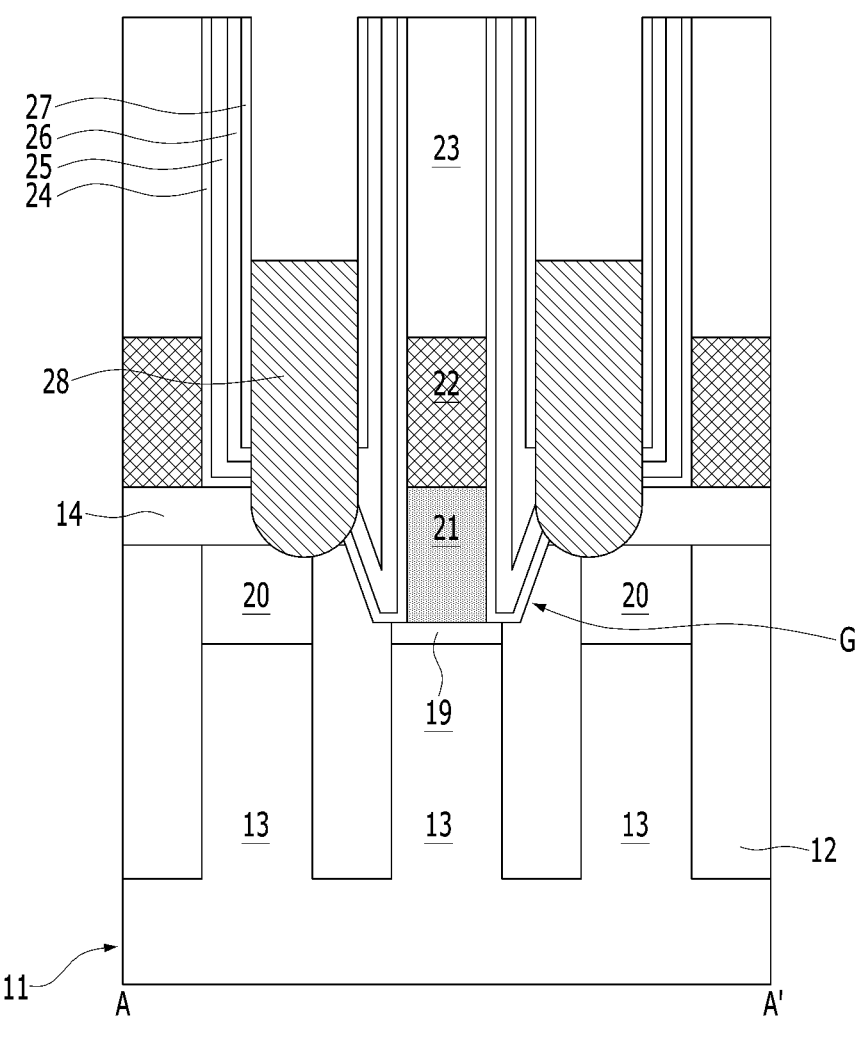
Figure 11C:
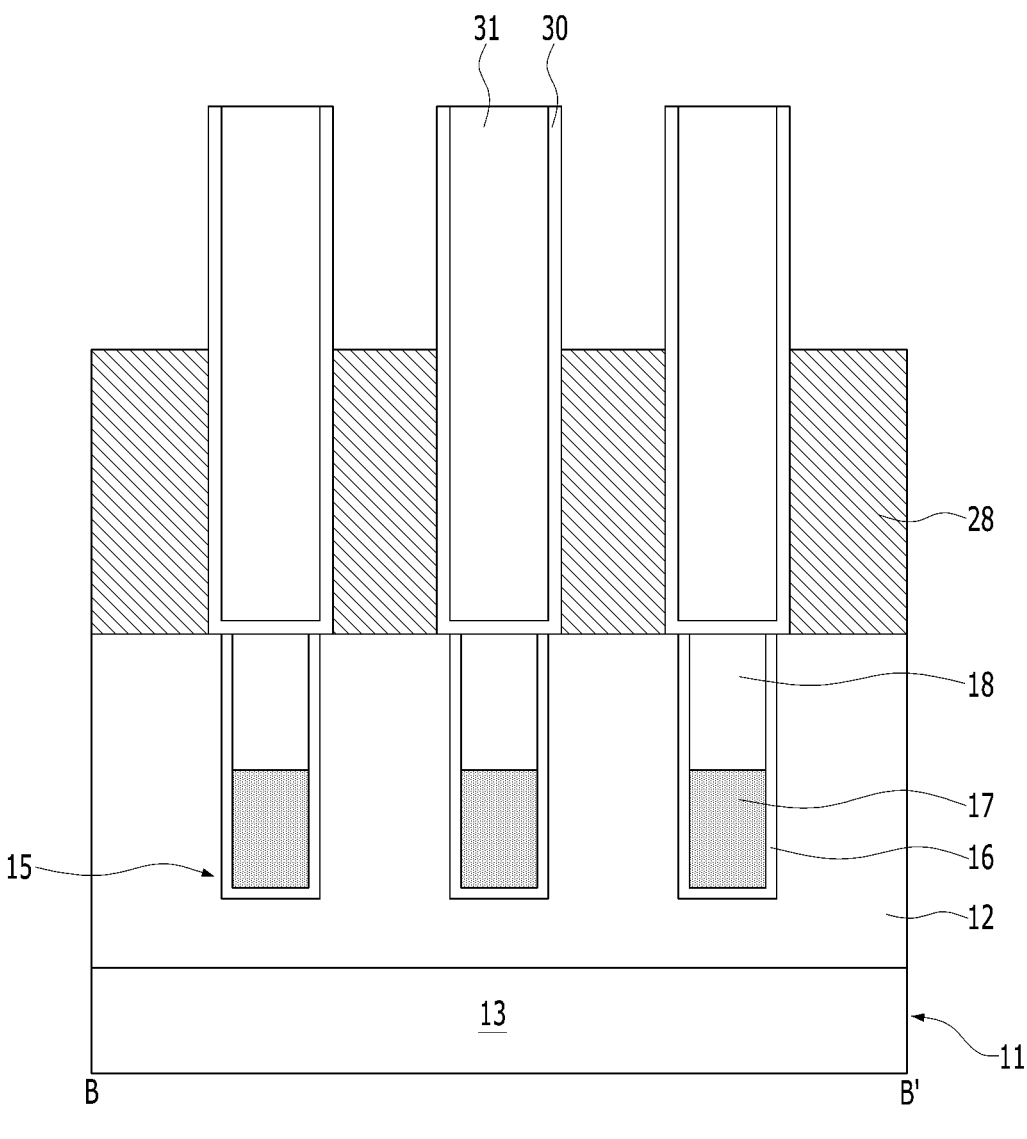

Referring to FIGS. 11A to 11C, the first contact 28 may be recessed. The first contact 28 may be recessed by an etch back process. The upper surface of the recessed first contact 28 may be positioned at a higher level than the bottom surface of the bit line hard mask 23. According to another embodiment of the present invention, the upper surface of the recessed first contact 28 may be positioned at the same level as the upper surface of the bit line 22. In other words, the recessed first contact 28 may overlap with the bit line 22 in the horizontal direction.

Figure 12A:
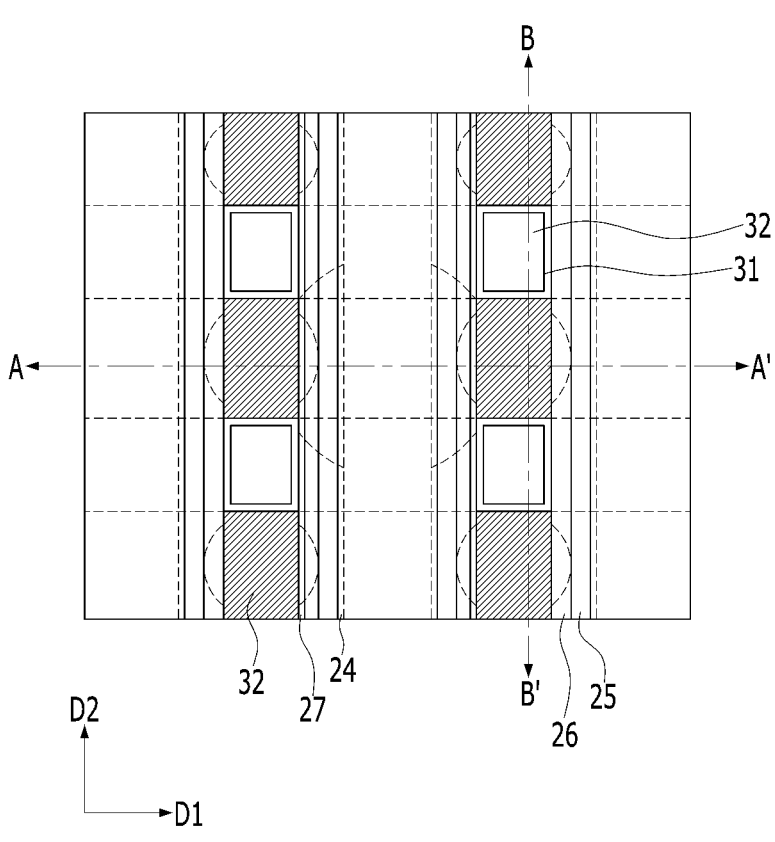
FIGS. 12A to 12C illustrate a method for fabricating a semiconductor device.
Figure 12B:
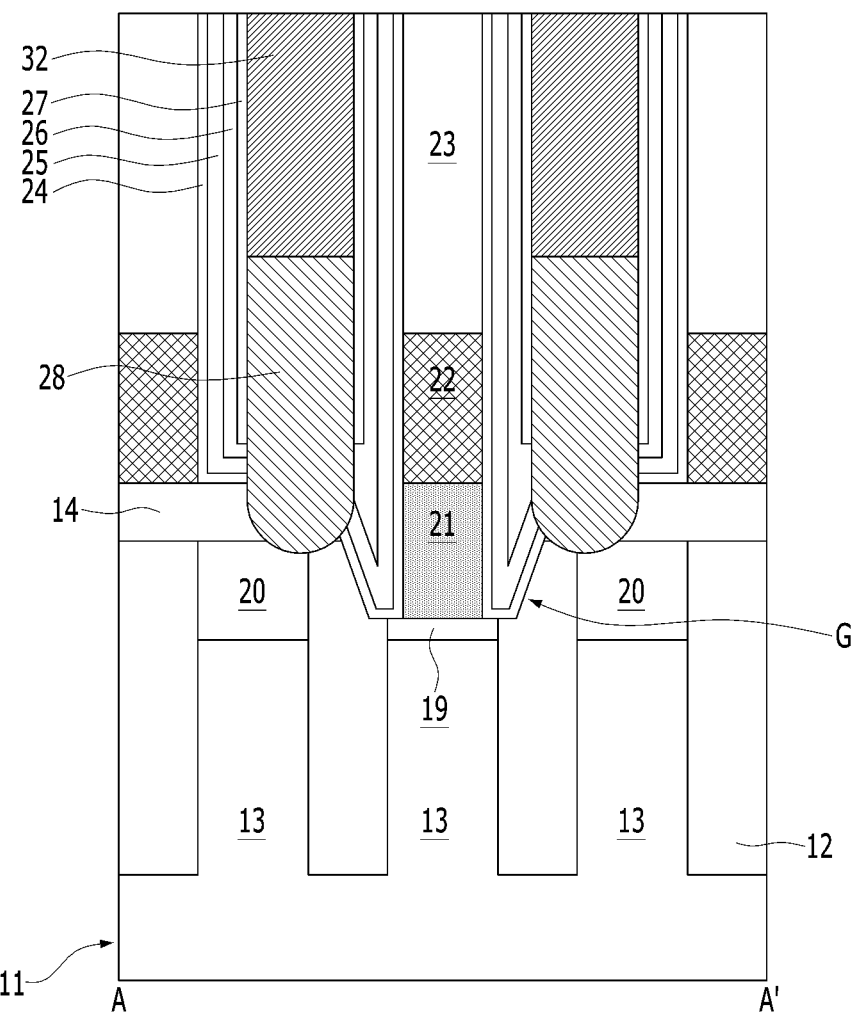
Figure 12C:
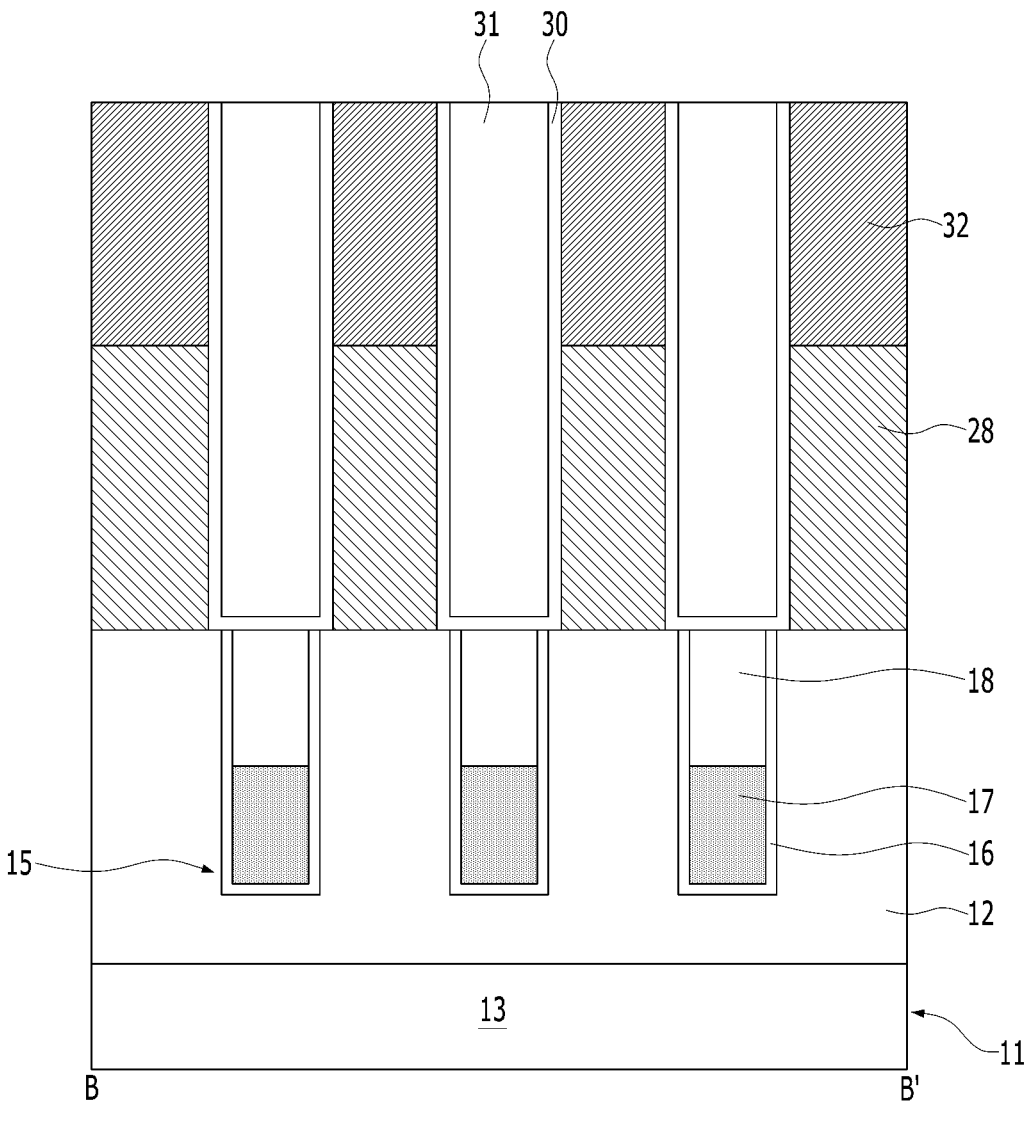

Referring to FIGS. 12A to 12C, a second conductive structure may be formed by forming a second contact 32 over the first contact 28. The second conductive structure may serve to electrically connect the substrate 11 and memory element 35 (see FIG. 13A) to each other together with a landing pad 34 (see FIG. 13A) which is to be formed through a subsequent process. The second conductive structure is referred to herein as a 'storage node contact plug'.

The second contact 32 may be a metal material. The bottom surface of the second contact 32 may be positioned at a higher level than the upper surface of the bit line 22. The second contact 32 may not horizontally overlap with the bit line 22. The second contact 32 may horizontally overlap with the bit line hard mask 23.

Figure 13A:
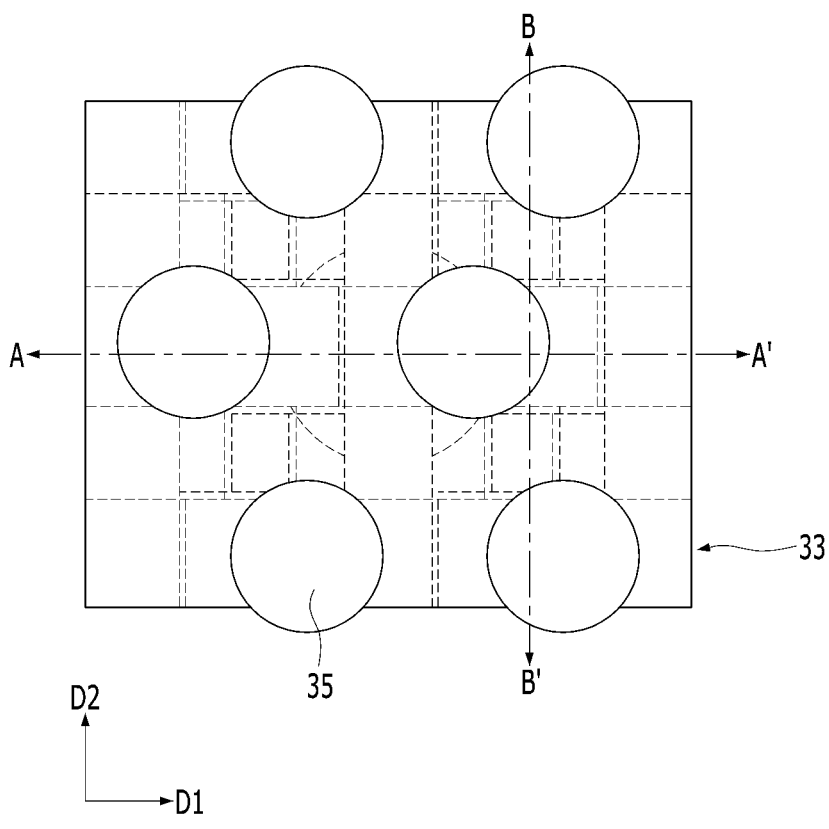
FIGS. 13A to 13C illustrate a method for fabricating a semiconductor device.
Figure 13B:
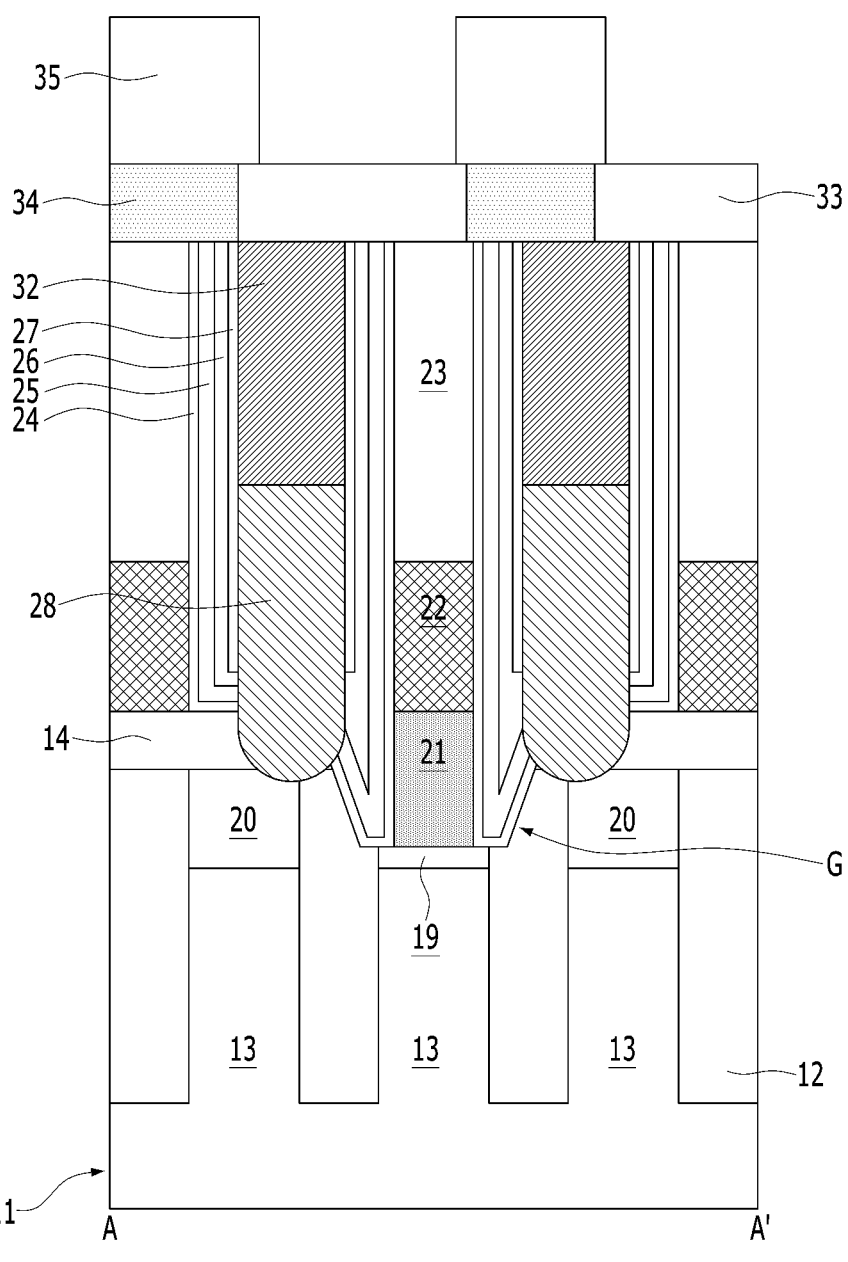
Figure 13C:
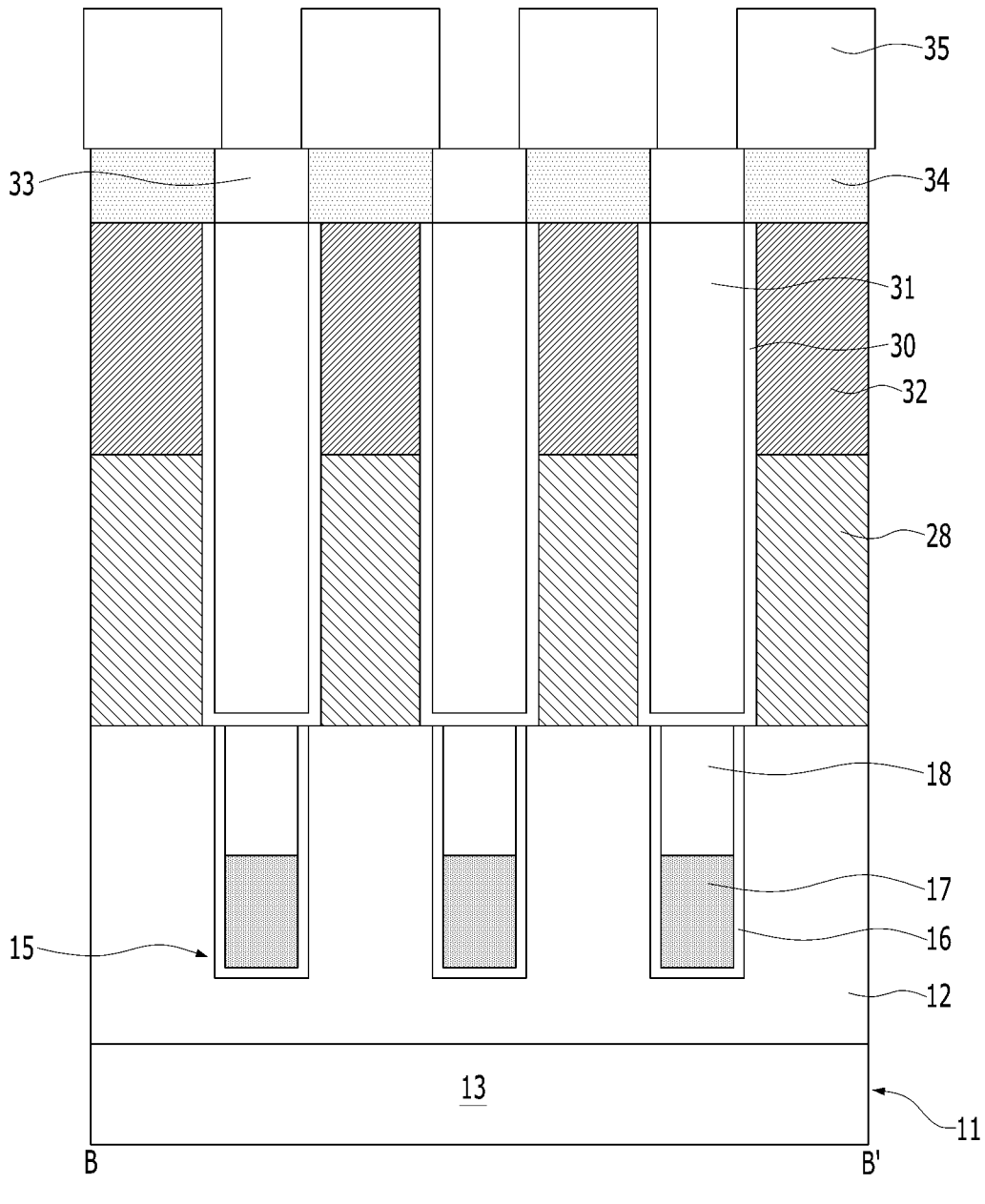

Referring to FIGS. 13A to 13C, a landing pad 34 may be formed over the second contact 32. The landing pads 34 may be positioned to be spaced apart from each other by an inter-layer dielectric layer 33. From the perspective of a plan view, the landing pad 34 may be formed in an island type.

Subsequently, a memory element 35 including a capacitor may be formed over the landing pad 33.

The memory element 35 may be a capacitor including a storage node. The storage node may be a pillar type. A dielectric layer and a plate node may be further formed over the storage node. The storage node may have a cylindrical shape other than a pillar shape.

According to one embodiment of the present invention, reliability of a semiconductor device may be improved by applying a low-k spacer to a sidewall of a conductive structure and thereby reducing parasitic capacitance.

While the present invention has been described with respect to the specific embodiments, it will be apparent to those skilled in the art that various changes and modifications may be made without departing from the scope of the invention.

What is claimed is:

1. A semiconductor device, comprising:
a semiconductor substrate;
a first conductive structure formed over the semiconductor substrate; and
a spacer structure in which a diffusion barrier layer, a first low-k spacer, and a second low-k spacer having a higher dielectric constant than the first low-k spacer are sequentially stacked from a sidewall of the first conductive structure,
wherein the diffusion barrier layer includes silicon nitride, and
wherein the first and second low-k spacers include a carbon-doped silicon-based material.

2. The semiconductor device of claim 1, wherein the diffusion barrier layer is in direct contact with the sidewall of the first conductive structure and includes a liner layer having a continuous uniform thickness.

3. The semiconductor device of claim 1, wherein the diffusion barrier layer has a thickness of at least approximately 20 Å or more.

4. The semiconductor device of claim 1, wherein the first low-k spacer includes a material having a dielectric constant of 4.1 or less.

5. The semiconductor device of claim 1, wherein the second low-k spacer includes a material having a dielectric constant of 4.4 or less.

6. The semiconductor device of claim 1, wherein the first and second low-k spacers include SiCO.

7. The semiconductor device of claim 1, wherein the first low-k spacer and the second low-k spacer include a carbon-doped silicon-based material, and
a carbon concentration in the first low-k spacer is lower than a carbon concentration in the second low-k spacer.

8. The semiconductor device of claim 1, wherein a thickness of the second low-dielectric constant spacer is smaller than a thickness of the first low-dielectric constant spacer.

9. The semiconductor device of claim 1, wherein the second low-k spacer has a lower etch rate than the first low-k spacer.

10. The semiconductor device of claim 1, further comprising:
an oxide spacer between the diffusion barrier layer and the first low-k spacer.

11. The semiconductor device of claim 1, further comprising:
a second conductive structure in contact with an exposed sidewall of the second low-k spacer.

12. The semiconductor device of claim 11, wherein the first conductive structure includes a bit line structure, and
the second conductive structure includes a storage node contact plug.

* * * * *